(12) United States Patent
Lee et al.

(10) Patent No.: US 11,588,039 B2
(45) Date of Patent: Feb. 21, 2023

(54) SEMICONDUCTOR DEVICE

(71) Applicant: Samsung Electronics Co., Ltd., Suwon-si (KR)

(72) Inventors: Chan-hyeong Lee, Seoul (KR); Hoon-joo Na, Hwaseong-si (KR); Sung-in Suh, Seoul (KR); Min-woo Song, Seongnam-si (KR); Byoung-hoon Lee, Suwon-si (KR); Hu-yong Lee, Seoul (KR); Sang-jin Hyun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 263 days.

(21) Appl. No.: 16/694,242

(22) Filed: Nov. 25, 2019

(65) Prior Publication Data

US 2020/0098882 A1 Mar. 26, 2020

Related U.S. Application Data

(63) Continuation of application No. 15/915,508, filed on Mar. 8, 2018, now Pat. No. 10,529,816.

(30) Foreign Application Priority Data

Sep. 13, 2017 (KR) .................. 10-2017-0117229

(51) Int. Cl.
*H01L 29/06* (2006.01)
*H01L 29/49* (2006.01)
(Continued)

(52) U.S. Cl.
CPC .......... *H01L 29/4908* (2013.01); *B82Y 10/00* (2013.01); *H01L 21/28088* (2013.01);
(Continued)

(58) Field of Classification Search
CPC ............. B82Y 10/00; H01L 21/28088; H01L 21/8221; H01L 21/823412; H01L 21/84;
(Continued)

(56) References Cited

U.S. PATENT DOCUMENTS 8,115,264 B2 2/2012 Park et al.
8,647,972 B1 2/2014 Ando et al.
(Continued)

FOREIGN PATENT DOCUMENTS

KR 2016-0102972 A 8/2016
KR 10-2017-0042558 4/2017
WO WO-2017-111848 A1 6/2017

OTHER PUBLICATIONS

Written Opinion from the Intellectual Property Office of Singapore dated Oct. 17, 2018 for corresponding Application No. 10201803922P.
(Continued)

*Primary Examiner* — Matthew C Landau
*Assistant Examiner* — Dmitriy Yemelyanov
(74) *Attorney, Agent, or Firm* — Harness, Dickey & Pierce, P.L.C.

(57) ABSTRACT

A semiconductor device includes an active region in a substrate, at least one nano-sheet on the substrate and spaced apart from a top surface of the active region, a gate above or below the nano-sheet, a gate insulating layer between the at least one nano-sheet and the gate, and source/drain regions on the active region at both sides of the at least one nano-sheet. The at least one nano-sheet includes a channel region; a gate disposed above or below the nano-sheet and including a single metal layer having different compositions of metal atoms of a surface and an inside thereof; a gate insulating layer between the nano-sheet and the gate; and source/drain regions disposed in the active region of both sides of the at least one nano-sheet.

12 Claims, 20 Drawing Sheets

(51) Int. Cl.
*H01L 29/423* (2006.01)
*H01L 29/786* (2006.01)
*H01L 21/28* (2006.01)
*H01L 29/66* (2006.01)
*H01L 29/775* (2006.01)
*H01L 27/088* (2006.01)
*B82Y 10/00* (2011.01)
*H01L 27/06* (2006.01)
*H01L 21/8234* (2006.01)
*H01L 29/417* (2006.01)
*H01L 21/822* (2006.01)
*H01L 21/84* (2006.01)

(52) U.S. Cl.
CPC .. *H01L 21/8221* (2013.01); *H01L 21/823412* (2013.01); *H01L 27/0688* (2013.01); *H01L 27/088* (2013.01); *H01L 29/0673* (2013.01); *H01L 29/41725* (2013.01); *H01L 29/42372* (2013.01); *H01L 29/42392* (2013.01); *H01L 29/4958* (2013.01); *H01L 29/66439* (2013.01); *H01L 29/66742* (2013.01); *H01L 29/775* (2013.01); *H01L 29/78618* (2013.01); *H01L 29/78696* (2013.01); *H01L 21/84* (2013.01); *H01L 29/78681* (2013.01); *H01L 29/78684* (2013.01)

(58) Field of Classification Search
CPC ............... H01L 27/0688; H01L 27/088; H01L 29/0673; H01L 29/41725; H01L 29/42372; H01L 29/42392; H01L 29/4908; H01L 29/4958; H01L 29/66439; H01L 29/66742; H01L 29/775; H01L 29/78618; H01L 29/78681; H01L 29/78684; H01L 29/78696
See application file for complete search history.

(56) References Cited

U.S. PATENT DOCUMENTS

| | | | |
|---|---|---|---|
| 9,035,398 | B2 | 5/2015 | Won et al. |
| 9,293,334 | B2 | 3/2016 | Kuo et al. |
| 9,620,610 | B1 | 4/2017 | Jangjian et al. |
| 2008/0290394 | A1* | 11/2008 | Duan ................ H01L 29/7885 257/E21.294 |
| 2009/0065873 | A1 | 3/2009 | Park et al. |
| 2012/0217590 | A1* | 8/2012 | Babich ................ H01L 29/4966 257/410 |
| 2012/0315749 | A1* | 12/2012 | Hempel ............. H01L 29/7833 257/E21.409 |
| 2014/0001441 | A1* | 1/2014 | Kim ................ H01L 29/42392 257/29 |
| 2014/0084387 | A1 | 3/2014 | Dewey et al. |
| 2014/0264481 | A1* | 9/2014 | Hung ................ H01L 23/5384 257/288 |
| 2014/0319616 | A1* | 10/2014 | Baudot ............ H01L 21/28079 257/369 |
| 2015/0041926 | A1 | 2/2015 | Pradhan et al. |
| 2015/0084041 | A1 | 3/2015 | Hur et al. |
| 2017/0005176 | A1* | 1/2017 | Sung ................ H01L 29/42392 |
| 2017/0110554 | A1 | 4/2017 | Tak et al. |
| 2017/0133434 | A1 | 5/2017 | Ueki et al. |
| 2017/0207312 | A1 | 7/2017 | Jan et al. |

OTHER PUBLICATIONS

Office Action dated Jul. 22, 2021, issued in corresponding Korean Patent Application No. 10-2017-0117229.

* cited by examiner

SEMICONDUCTOR DEVICE

CROSS-REFERENCE TO RELATED APPLICATION

This application is a continuation of U.S. patent application Ser. No. 15/915,508, filed Mar. 8, 2018, which claims the benefit of Korean Patent Application No. 10-2017-0117229, filed on Sep. 13, 2017, in the Korean Intellectual Property Office, the disclosure of each of which is incorporated herein in its entirety by reference.

BACKGROUND

Inventive concepts relate to a semiconductor device, and more particularly, to a semiconductor device including a nano-sheet.

Semiconductor devices, for example, metal-oxide-semiconductor field-effect transistors (MOSFETs), may have threshold voltages having different amplitudes (values) according to desired (and/or alternatively predetermined) regions of a substrate. Furthermore, it may be desirable to reduce the resistivity of a gate in a semiconductor device. In particular, as a semiconductor device including a nano-sheet is down-scaled, the semiconductor device may have a threshold voltage having various amplitudes (values) or reducing the resistivity of the gate may be required.

SUMMARY

Inventive concepts relate to a semiconductor device that may have a threshold voltage with various magnitudes (values) and resistivity of a gate may be reduced when the semiconductor device includes a nano-sheet.

According to some example embodiments of inventive concepts, a semiconductor device includes a substrate, an active region in the substrate, a nano-sheet spaced apart from a top surface of the active region, a gate above or below the nano-sheet and including a single metal layer having different compositions of metal atoms at a surface and an inside thereof, a gate insulating layer between the nano-sheet and the gate, and source/drain regions in the active region at both sides of the nano-sheet. The nano-sheet may include a channel region.

According to some example embodiments of inventive concepts, a semiconductor device includes a substrate including an active region, at least one nano-sheet stack structure on the substrate and spaced apart from a top surface of the active region, a gate covering the at least one nano-sheet stack structure, a gate insulating layer between the at least one nano-sheet stack structure and the gate, and source/drain regions in the active region. The at least one nano-sheet stack structure may include a plurality of nano-sheets that each may include a channel region. The gate may include a main gate portion on the at least one nano-sheet stack structure and sub-gate portions below each of the plurality of nano-sheets. The sub-gate portions may include a single metal layer having different compositions of metal atoms at a surface and an inside thereof. The source/drain regions may be at a side of the at least one nano-sheet stack structure.

According to some example embodiments of inventive concepts, a semiconductor device may include a substrate including a fin-type active region protruding from the substrate and extending in a first direction, a plurality of nano-sheets on the substrate, a gate on the fin-type active region, a gate insulating layer between the plurality of nano-sheets and the gate, and source/drain regions in the fin-type active region at both sides of the plurality of nano-sheets. The plurality of nano-sheets may be parallel to a top surface of the fin-type active region and may be stacked on top of each other and each may include a channel region. The plurality of nano-sheets may be spaced apart from each other and may be spaced apart from the top surface of the fin-type active region. The gate may extend in a second direction that crosses the first direction. The gate may surround at least a portion of each of the plurality of nano-sheets. The gate may include a main gate portion and a plurality of sub-gate portions. The main gate portion may be on the plurality of nano-sheets. The plurality of sub-gate portions may be between the plurality of nano-sheets and the fin-type active region. The plurality of sub-gate portions may include a single metal layer having different compositions of metal atoms at a surface and an inside thereof.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
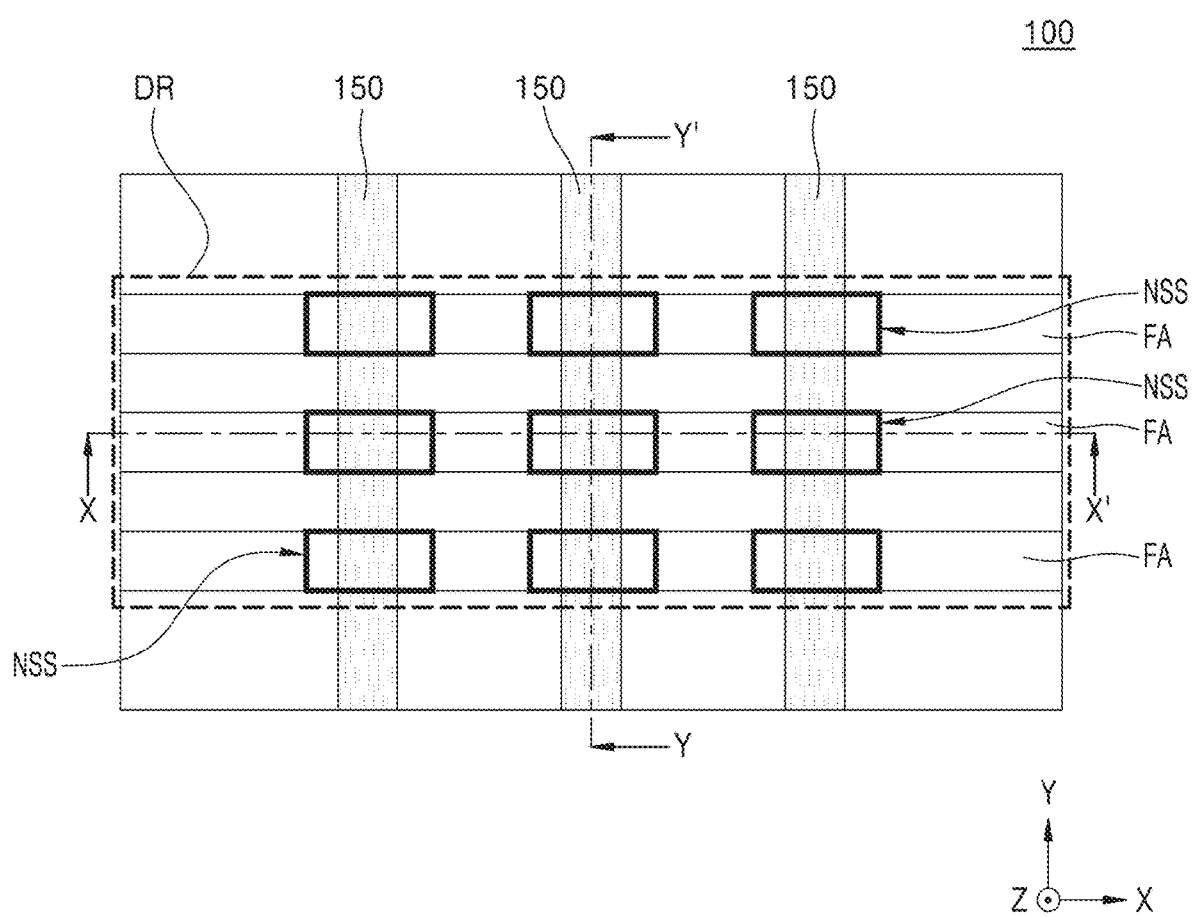
FIG. 1 is a planar layout view of a semiconductor device according to some embodiments of inventive concepts.
Figure 2:
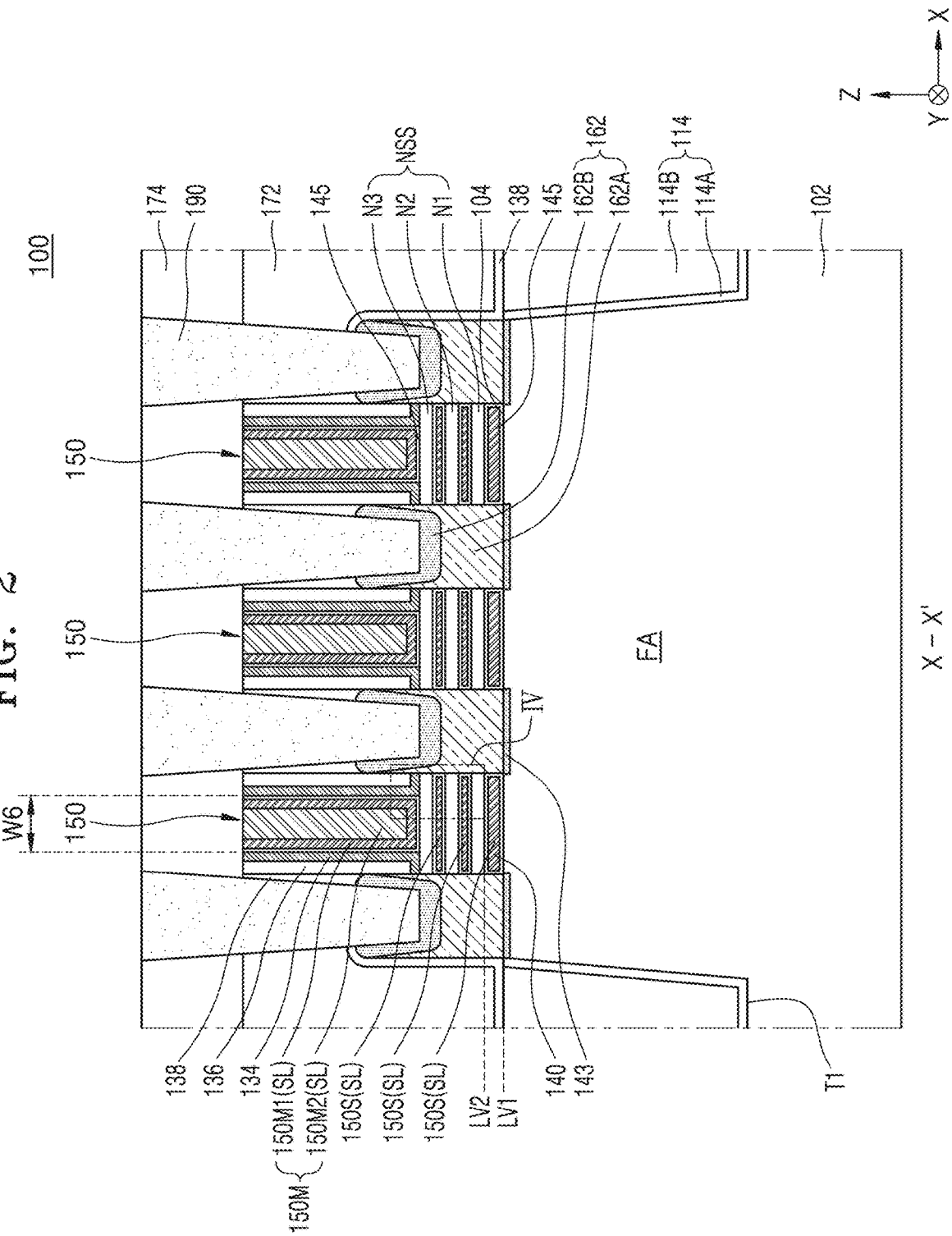
FIG. 2 is a cross-sectional view taken along line X-X' of FIG. 1.

FIG. 1 is a planar layout view of a semiconductor device according to some embodiments of inventive concepts, and FIG. 2 is a cross-sectional view taken along line X-X' of FIG. 1.

In detail, a semiconductor device 100 according to some embodiments of inventive concepts may be an integrated circuit semiconductor device. The semiconductor device 100 according to some embodiments of inventive concepts may include a multi-bridge channel field effect transistor (FET). The semiconductor device 100 may be an N-channel metal oxide semiconductor (NMOS) or a P-channel MOS (PMOS).

The semiconductor device 100 includes a plurality of fin-type active regions FA, which protrude from a substrate 102, extend in a first direction (X-direction) and are spaced apart from each other by a desired (and/or alternatively predetermined) distance in a second direction (Y-direction). The semiconductor device 100 includes a plurality of nano-sheet stack structures NSS that face a top surface 104 of each of the plurality of fin-type active regions FA fin-type with a desired (and/or alternatively predetermined) distance therebetween. The first direction (X-direction) and the second direction (Y-direction) may be perpendicular to each other. The nano-sheet stack structures NSS are spaced apart from each other by a desired (and/or alternatively predetermined) distance in the first direction (X-direction) and the second direction (Y-direction).

A first trench T1 for defining the fin-type active region FA, and a second trench T2 for defining a device region DR may be formed in the substrate 102. A lower sidewall of the fin-type active region FA may be covered with a shallow trench isolation (STI) layer 114 for filling the first trench T1.

The STI layer 114 may include a trench insulating liner 114A that covers an inner wall of the first trench T1 conformally, and a gap fill insulating layer 114B on the trench insulating liner 114A so as to fill the first trench T1. The second trench T2 may be filled with an isolation layer 116. A level of the fin-type active region FA, a level of a top surface of the STI layer 114, and a level of a top surface of the isolation layer 116 may be identical or similar to one another.

In some embodiments, the isolation layer 116 for filling the second trench T2 may include a silicon oxide layer, a silicon nitride layer, or a combination thereof. In some embodiments, the isolation layer 116 and the gap fill insulating layer 114B may be formed of the same material.

A plurality of gates 150 may be formed in the plurality of fin-type active regions FA and may extend in the second direction (Y-direction) that crosses the first direction (X-direction) and are spaced apart from each other in the first direction. Each of the plurality of gates 150 may have a gate length as a width W6 of a gate structure space (see SP6 of FIGS. 14 and 15) in the extension direction (X-direction) of the fin-type active region FA.

The fin-type active region FA has the top surface 104 at a first level LV1. The nano-sheet stack structure NSS is spaced apart from the top surface 104 of the fin-type active region FA by a desired (and/or alternatively predetermined) distance. The nano-sheet stack structure NSS may include a plurality of nano-sheets N1, N2, and N3, which are spaced apart from each other in parallel to the top surface 104 of the fin-type active region FA at a second level LV2 that is higher than the first level LV1 from the substrate 102.

In some embodiments, the plurality of nano-sheets N1, N2, and N3 may have various shapes, for example, may be changed into nano-wires. Each of the nano-sheets N1, N2, and N3 may have a thickness of several nano-sizes.

In some embodiments, a plurality of nano-sheet stack structures NSS and a plurality of gates 150 are formed in one fin-type active region FA, and the plurality of nano-sheet stack structures NSS are disposed in a line in one fin-type active region FA in the extension direction (X-direction) of the fin-type active region FA. However, embodiments of inventive concepts are not limited thereto. The number of nano-sheet stack structures NSS disposed in one fin-type active region FA is not specifically limited. For example, one nano-sheet stack structure may also be formed in one fin-type active region FA.

Nano-sheets N1, N2, and N3 that constitute the nano-sheet stack structure NSS are disposed sequentially one by one on the top surface 104 of the fin-type active region FA. In some embodiments, one nano-sheet stack structure NSS includes three nano-sheets N1, N2, and N3. However, embodiments of inventive concepts are not limited thereto. For example, the semiconductor device 100 may not include three nano-sheets N1, N2, and N3 but may include one nano-sheet. The semiconductor device 100 may also include a plurality of nano-sheets to be selected in various manners if necessary. Each of the plurality of nano-sheets N1, N2, and N3 may have a channel region.

Figure 3:
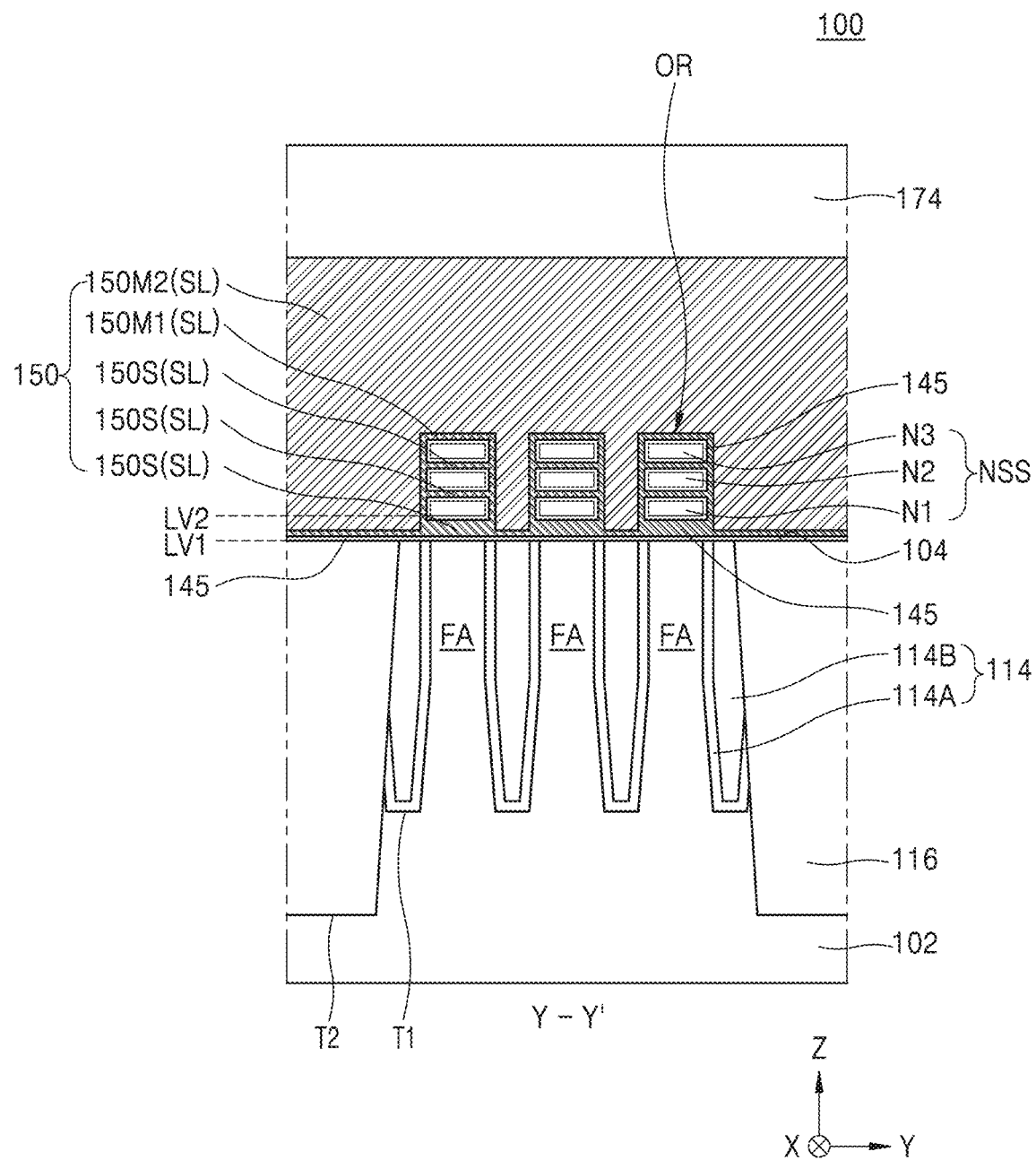
FIG. 3 is a cross-sectional view taken along line Y-Y' of FIG. 1.

Each of the gates 150 may be formed to surround at least a portion of the plurality of nano-sheets N1, N2, and N3 while covering the nano-sheet stack structure NSS, as illustrated in FIG. 3. The gate 150 may be disposed above or below each of the nano-sheets N1, N2, and N3. The gate 150 may include a main gate portion 150M that covers a top surface of the nano-sheet stack structure NSS, and a plurality of sub-gate portions 150S, which are connected to the main gate portion 150M and are formed in a space between the fin-type active region FA and the bottommost nano-sheet N1 and a space between the nano-sheets N1, N2, and N3.

The main gate portion 150M may include a barrier metal layer 150M1 disposed on the topmost nano-sheet N3 of the nano-sheet stack structure NSS and a main metal layer 150M2 formed on the barrier metal layer 150M1, as illustrated in FIG. 2. The barrier metal layer 150M1 may be formed on a surface and sidewalls of the nano-sheet stack structure NSS, as illustrated in FIG. 3. The main metal layer 150M2 may include a tungsten (W) layer or an aluminum (Al) layer. The main gate portion 150M includes a double layer. However, this is just an example, and the main gate portion 150M may be implemented with a multiple layer.

The gate 150, in particular, the sub-gate portions 150S and the barrier metal layer 150M1, may include a single metal layer SL having different compositions of metal atoms of a surface and an inside thereof. In some embodiments, a difference in compositions of the metal atoms of the surface and the inside of the single metal layer SL may be equal to or less than 5%. In some embodiments, the single metal layer SL that constitutes the sub-gate portions 150S and the barrier metal layer 150M1 may include a titanium (Ti) Al (TiAl) layer, a TiAlC layer, or a TiAlN layer. The single metal layer SL may include one layer. In some embodiments, the barrier metal layer 150M1 may also include a multiple metal layer, if necessary.

When the compositions of the surface and the inside of the metal atoms that constitute the single metal layer SL, for example, compositions of a surface and an inside of Al atoms that constitute the single metal layer SL are different from each other, a work function of the gate 150 may be adjusted. When the work function of the gate 150 is adjusted, a threshold voltage of the semiconductor device 100 may be diverse and/or may vary.

Furthermore, when the composition of the surface of the metal atoms that constitute the single metal layer SL, for example, the composition of the surface of the Al atoms is lower than the composition of the inside thereof, resistivity of the single metal layer SL may be reduced. Also, when the composition of the surface of the metal atoms that constitute the single metal layer SL, for example, the composition of the surface of Ti atoms is higher than the composition of the inside thereof, resistivity of the single metal layer SL may be reduced. In this way, relative composition ratios of the surface and the inside of the metal atoms that constitute the single metal layer SL, for example, the Al atoms or Ti atoms, are adjusted so that resistivity of the single metal layer SL may be adjusted.

In some embodiments, the single metal layer SL that constitutes the sub-gate portions 150S and the barrier metal layer 150M1 may include base metal atoms, for example, Ti atoms and combination metal atoms combined or coupled to the base metal atoms, for example, Al atoms. The combination metal atoms may include work function-adjusting metal atoms. In some embodiments, the base metal atoms may include at least one from among tantalum (Ta), W, ruthenium (Ru), niobium (Nb), molybdenum (Mo), hafnium (Hf), and lanthanum (La).

In some embodiments, it may be difficult to form the gate 150, in particular, the sub-gate portions 150S as a multiple metal layer in a space between the nano-sheets N1, N2, and N3, for example, within a thickness of several micrometers. The multiple metal layer may include a layer with a stack of a plurality of metal layers. Thus, in the semiconductor device 100 according to some embodiments of inventive concepts, the sub-gate portions 150S are easily formed as the single metal layer SL having different compositions of the surface and the inside of metal atoms so that the effects of reducing resistivity or adjusting a work function may be achieved.

In some embodiments, a thickness of each of the plurality of sub-gate portions 150S may be less than the thickness of the main gate portion 150M. In some embodiments, the thickness of the bottommost sub-gate portion 150S from among the plurality of sub-gate portions 150S may be greater than thicknesses of the other sub-gate portions 150S. Here, the thickness of the plurality of sub-gate portions 150S and the thickness of the main gate portion 150M are sizes in the Z-direction in FIGS. 1 through 3.

A gate insulating layer (or a gate dielectric layer) 145 is formed between the nano-sheet stack structure NSS and the gate 150. The plurality of nano-sheets N1, N2, and N3 may be formed in an overlap region OR covered with the gate 150 in the space between the fin-type active region FA and the gate 150. In an X-Y plane, the nano-sheet stack structure NSS including the plurality of nano-sheets N1, N2, and N3 may have a larger planar area than a planar area of the overlap region OR.

In FIG. 1, the planar shape of the nano-sheet stack structure NSS is an approximately rectangular shape. However, embodiments of inventive concepts are not limited thereto. The nano-sheet stack structure NSS may have various planar shapes according to the planar shape of the fin-type active region FA and the planar shape of the gate 150. In some embodiments, the plurality of nano-sheets N1, N2, and N3 may be formed of the same material. In some embodiments, the plurality of nano-sheets N1, N2, and N3 may be formed of the same material as a material used to form the substrate 102.

Source/drain regions 162 are formed in the fin-type active region FA at both sides of the nano-sheets N1, N2, and N3. The source/drain regions 162 are connected to one end of each of the plurality of adjacent nano-sheets N1, N2, and N3. The source/drain regions 162 may include a semiconductor layer 162A grown from the fin-type active region FA and the plurality of nano-sheets N1, N2, and N3 using a selective epitaxial growth (SEG) process. The source/drain regions 162 may have an embedded SiGe structure including an epitaxially-grown Si layer, an epitaxially-grown SiC layer, and a plurality of epitaxially-grown SiGe layers.

The source/drain regions 162 may further include a metal silicide layer 162B formed on the semiconductor layer 162A. In some embodiments, the metal silicide layer 162B may include titanium silicide. However, embodiments of inventive concepts are not limited thereto. In some embodiments, the metal silicide layer 162B may be omitted. A gate insulating liner 134, an outer spacer 136, and a gate protection layer 138 are formed on the plurality of nano-sheet stack structures NSS so as to cover sidewalls of the gate 150 sequentially.

The gate protection layer 138 may extend to cover the plurality of source/drain regions 162. The gate protection layer 138 may include a silicon nitride layer. Each of the gate insulating liner 134, the outer spacer 136, and the gate protection layer 138 may include a silicon nitride layer. However, embodiments of inventive concepts are not limited thereto. In some embodiments, the gate protection layer 138 may be omitted. The gate insulating liner 134, the outer spacer 136, and the gate protection layer 138 may cover sidewalls of the main gate portion 150M of the gate 150.

A source/drain protection layer 143 is formed on the top surface 104 of the fin-type active region FA at one sidewall of each of the plurality of nano-sheets N1, N2, and N3. The source/drain protection layer 143 may be a semiconductor layer for protecting the source/drain regions 162 in a manufacturing process of the semiconductor device 100, for example, in an etching process.

In some embodiments, the outer spacer 136 may include an insulating layer having a surface on which it is not possible to perform seeding and epitaxial growth of semiconductor atoms. An inter-gate insulating layer 172 and an interlayer insulating layer 174 are sequentially formed on the plurality of source/drain regions 162. Each of the inter-gate insulating layer 172 and the interlayer insulating layer 174 may include a silicon oxide layer. However, embodiments of inventive concepts are not limited thereto. A contact plug 190 may be connected to each of the plurality of source/drain regions 162. The contact plug 190 may pass through the interlayer insulating layer 174, the inter-gate insulating layer 172, and the gate protection layer 138 and may be connected to the source/drain regions 162. The metal silicide layer 162B may be between the semiconductor layer 162A and the contact plug 190.

The contact plug 190 may include a metal, a conductive metal nitride, or a combination thereof. For example, the contact plug 190 may include W, Cu, Al, Ti, Ta, TiN, TaN, an alloy thereof, or a combination thereof. However, embodiments of inventive concepts are not limited to the above-described materials.

Figure 4:
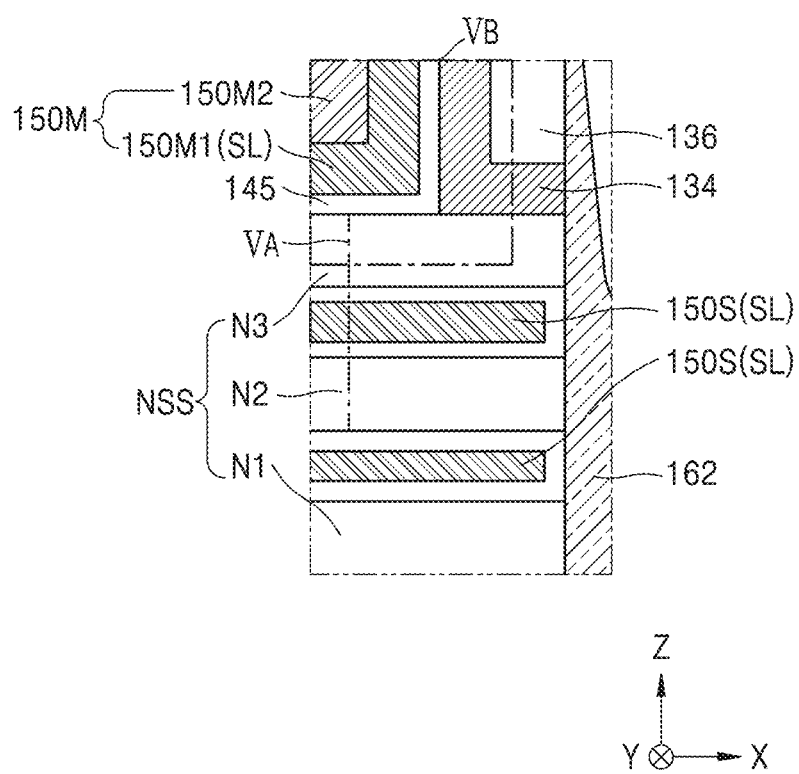
FIG. 4 is a detailed view of a region IV of FIG. 2.
Figure 5A:
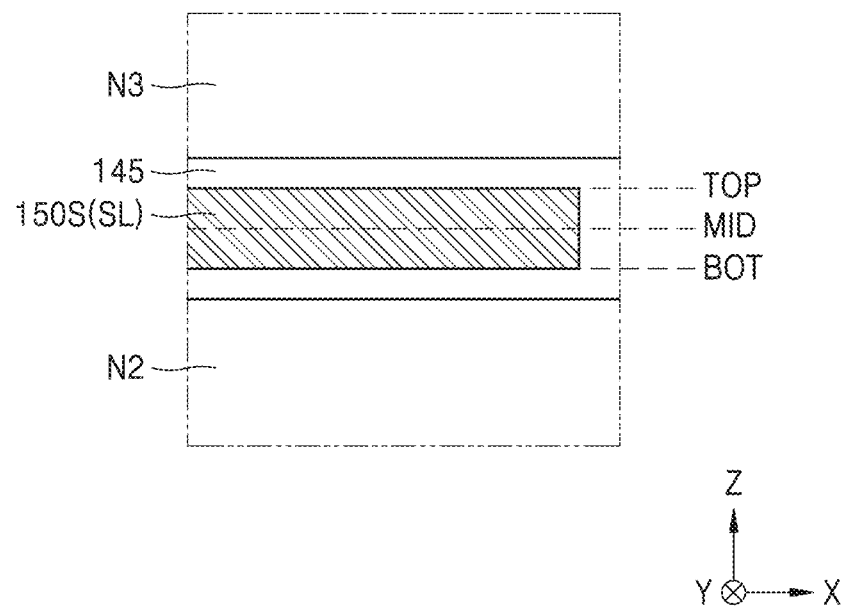
FIGS. 5A and 5B are enlarged views of regions VA and VB of FIG. 4.
Figure 5B:
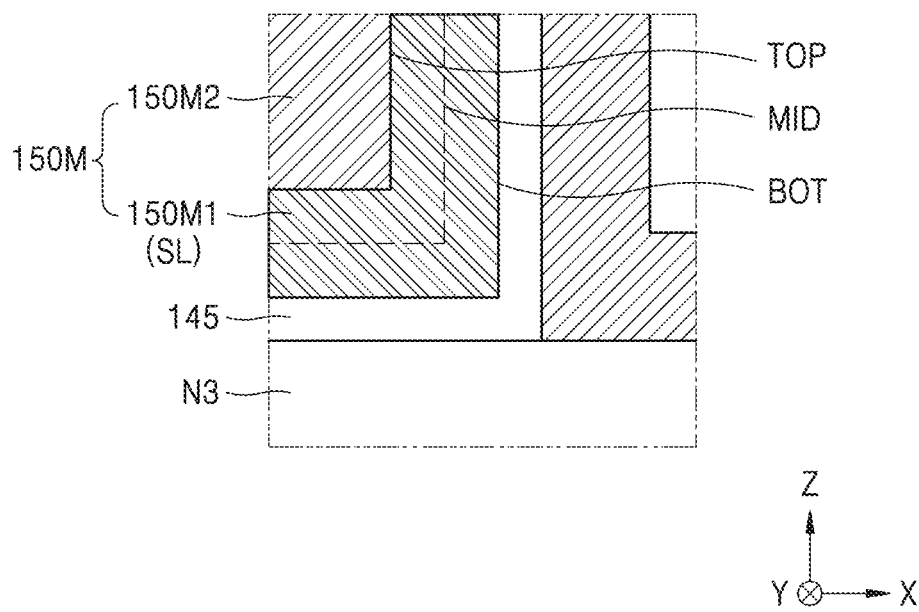

FIG. 4 is a detailed view of a region IV of FIG. 2, and FIGS. 5A and 5B are enlarged views of regions VA and VB of FIG. 4.

In detail, FIG. 4 illustrates a portion of a region including the nano-sheet stack structure NSS, the main gate portion 150M, the sub-gate portions 150S, the gate insulating layer 145, and the source/drain region 162 of the semiconductor device 100 illustrated in FIGS. 1 through 3.

FIG. 5A is an enlarged view of a portion of a region including the nano-sheets N2 and N3, the sub-gate portions 150S, and the gate insulating layer 145. FIG. 5B is an enlarged view of a portion of a region including the nano-sheet N3, the main gate portion 150M, the gate insulating layer 145, and the source/drain regions 162.

As described above, the gate 150 may include the main gate portion 150M and the sub-gate portions 150S. The main gate portion 150M may include a barrier metal layer 150M1 and a main metal layer 150M2.

As illustrated in FIG. 5A, the surface of the gate 150, e.g., the surface of the sub-gate portions 150S, may be a top portion TOP of the single metal layer SL or a bottom portion BOT of the single metal layer SL. In some embodiments, the surface of the gate 150 may refer to a surface neighborhood. The inside of the gate 150, e.g., the inside of the sub-gate portions 150S may include an inside medium portion MID of the single metal layer SL.

As illustrated in FIG. 5B, the surface of the gate 150, e.g., the surface of a barrier metal layer 150M1 of the main gate portion 150M, may be the top portion TOP of the single metal layer SL or the bottom portion BOT of the single metal layer SL. The inside of the gate 150, e.g., the inside of the barrier metal layer 150M1 of the main gate portion 150M, may include the inside medium portion MID of the single metal layer SL.

Referring to FIGS. 5A and 5B, in the semiconductor device according to some embodiments of inventive concepts, compositions of the metal atoms of the single metal layer SL that constitutes the sub-gate portions 150S and the barrier metal layer 150M1 may be changed from the surface of the gate insulating layer 145 to the center of the sub-gate portions 150S and the barrier metal layer 150M1 and the rear surface of the gate insulating layer 145 to the center of the sub-gate portions 150S and the barrier metal layer 150M1.

Furthermore, in the semiconductor device according to some embodiments of inventive concepts, the compositions of the metal atoms of the single metal layer SL that constitutes the sub-gate portions 150S and the barrier metal layer 150M1 may be changed away from the surface or the rear surface of the gate insulating layer 145 in a direction of the sub-gate portions 150S and the barrier metal layer 150M1.

Figure 6:
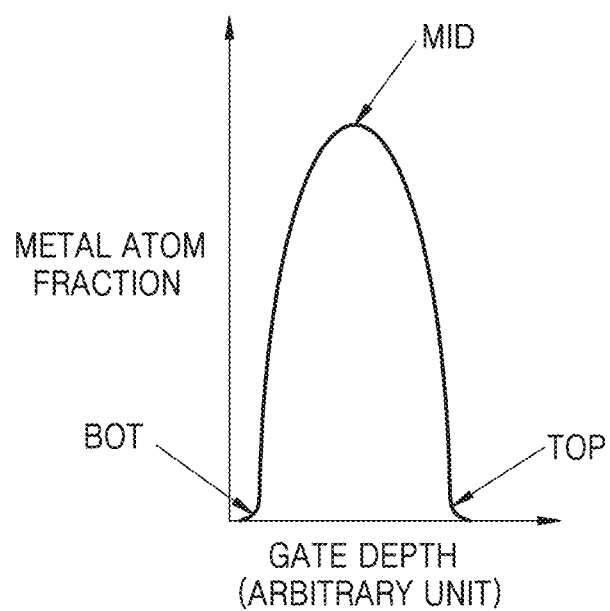
FIGS. 6, 7A, and 7B are graphs of a metal atom composition (fraction) of metal atoms according to a depth of a gate of the semiconductor device according to some embodiments of inventive concepts.
Figure 7A:
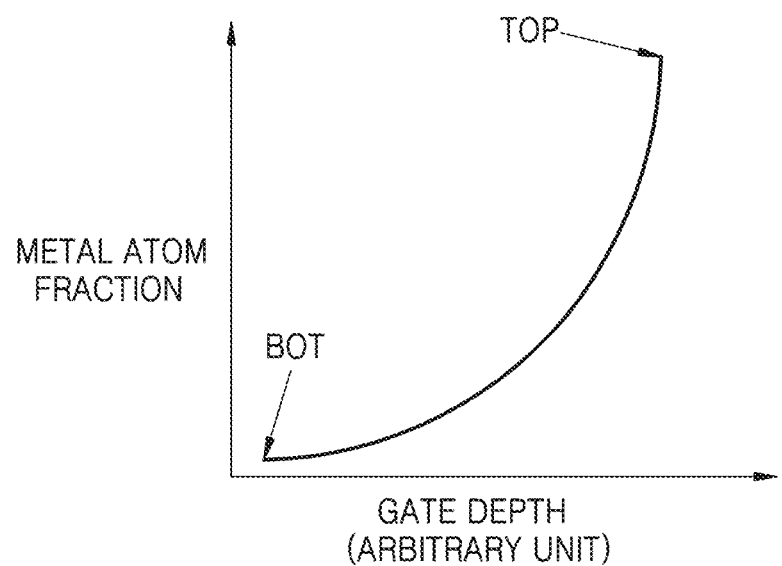
Figure 7B:
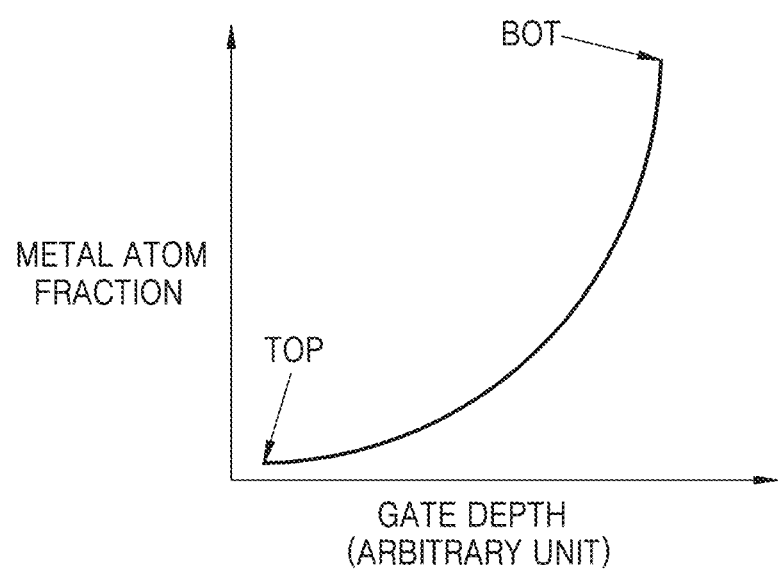

FIGS. 6, 7A, and 7B are graphs of a metal atom composition (fraction) according to a depth of a gate of the semiconductor device according to some embodiments of inventive concepts.

In detail, FIGS. 6, 7A, and 7B are graphs of fraction (composition) of metal atoms according to the depth of the single metal layer SL that constitutes the gate 150 of FIGS. 4 and 5. FIGS. 6, 7A, and 7B are views of a change in fraction (composition) of the metal atoms according to the depth of the single metal layer SL that constitute the gates 150 of FIGS. 4 and 5, e.g., the sub-gate portions 150S and the barrier metal layer 150M1 of the main gate portion 150M.

As illustrated in FIG. 6, the composition of the metal atoms may be reduced from the inside medium portion MID to the top portion TOP or bottom portion BOT of the single metal layer SL that constitutes the gate 150. Also, as illustrated in FIG. 6, the composition of the metal atoms may be increased in a parabolic form from the bottom portion BOT to the inside medium portion MID of the single metal layer SL that constitutes the gate 150 and may be reduced from the inside medium portion MID to the top portion TOP of the single metal layer SL.

As illustrated in FIG. 7A, the composition of the metal atoms may be gradually increased from the bottom portion BOT to the top portion TOP of the single metal layer SL that constitutes the gate 150. As illustrated in FIG. 7B, the composition of the metal atoms may be gradually increased from the top portion TOP to the bottom portion BOT of the single metal layer SL that constitutes the gate 150.

In this way, in the semiconductor device according to some embodiments of inventive concepts, the fraction (composition) of the metal atoms according to the depth of the single metal layer SL that constitutes the gate 150, e.g., the sub-gate portions 150S and the barrier metal layer 150M1 of the main gate portion 150M, may be changed in various ways. Thus, in the semiconductor device according to the inventive, a work function or resistivity of the single metal layer SL that constitutes the gate 150 may be easily adjusted.

FIGS. 8 through 16 are cross-sectional views of a method of manufacturing a semiconductor device, according to some embodiments of inventive concepts.

In detail, FIGS. 8 through 16 are a method of manufacturing the semiconductor device 100 illustrated in FIGS. 1 through 3. FIGS. 8 through 16 are cross-sectional views of portions corresponding to a cross-section taken along a line X-X' of FIG. 1. In FIGS. 8 through 16, same reference numerals as in FIGS. 1 through 3 represent like elements, and same descriptions thereof will be simply provided or omitted.

Figure 8:
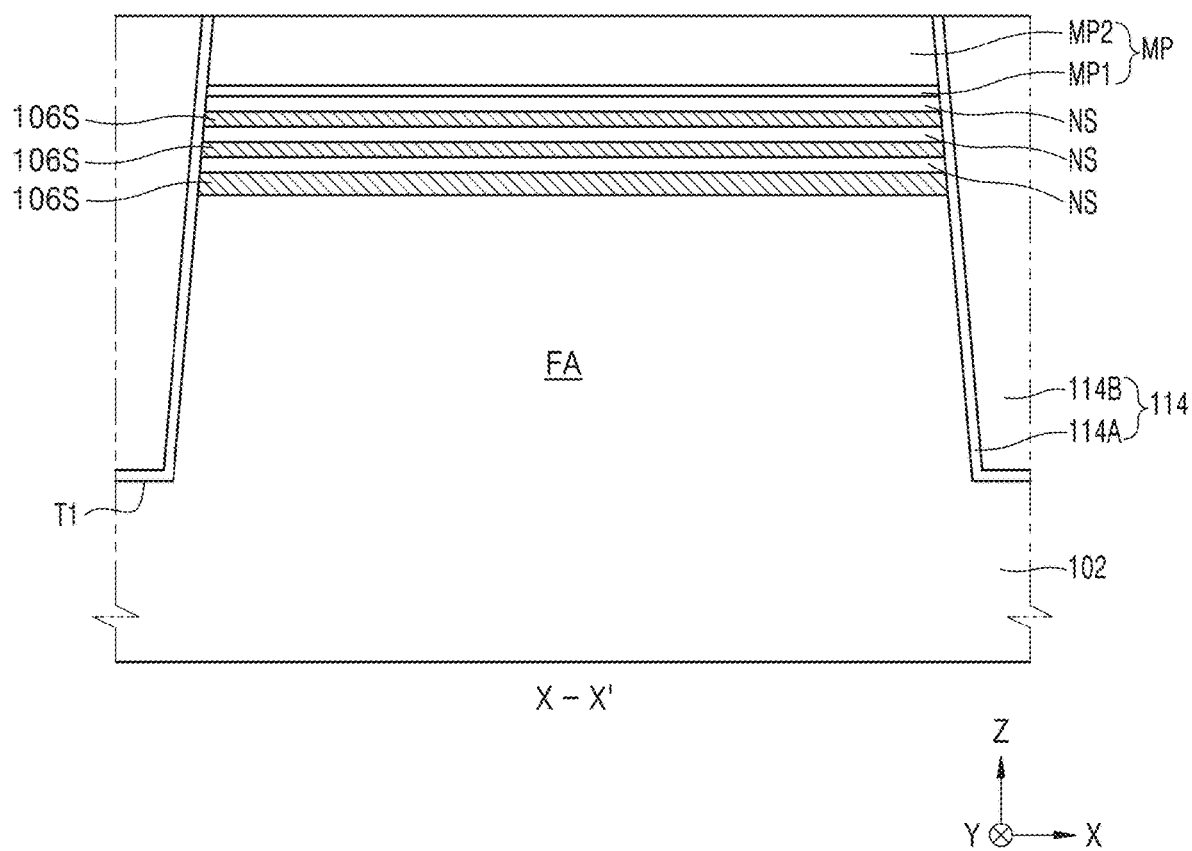
FIGS. 8 through 16 are cross-sectional views illustrating a method of manufacturing a semiconductor device, according to some embodiments of inventive concepts.

Referring to FIG. 8, a plurality of sacrificial semiconductor layers 106S and a plurality of nano-sheet semiconductor layers NS are alternately stacked one by one on the substrate 102. The plurality of sacrificial semiconductor layers 106S and the plurality of nano-sheet semiconductor layers NS may be formed using an epitaxial growth method.

The substrate 102 may include a semiconductor, such as silicon (Si) or germanium (Ge), or a compound semiconductor, such as SiGe, SiC, GaAs, InAs, or InP. In some embodiments, the substrate 102 may include at least one from among a Group III-V material and a Group IV material.

The Group III-V material may be a binary, ternary, or quaternary compound including at least one Group III element and at least one Group V element. The Group III-V material may be a compound including at least one from among indium (In), gallium (Ga), and Al that are Group III elements, and at least one from among arsenic (As), phosphorus (P), and antimony (Sb) that are Group V elements.

For example, the Group III-V material may be selected from InP, $In_zGa1-zAs$ ($0 \leq z \leq 1$), and $Al_zGa1-zAs$ ($0 \leq z \leq 1$). The binary compound may be one from among InP, GaAs, InAs, InSb, and GaSb, for example. The ternary compound may be one from among InGaP, InGaAs, AlInAs, InGaSb, GaAsSb, and GaAsP. The Group IV material may be Si or Ge. However, the Group III-V material and the Group IV material that may be used in the semiconductor device according to some embodiments of inventive concepts are not limited to the above example.

The Group III-V material and the Group IV material such as Ge may be used as a channel material that may be used to manufacture a low-power and high-speed transistor. A complementary metal oxide semiconductor (CMOS) having high performance may be formed using a semiconductor substrate formed of the Group III-V material having high mobility of electrons compared to an Si substrate, for example, GaAs and a semiconductor substrate formed of a semiconductor material having high mobility of electrons compared to the Si substrate, for example, Ge.

In some embodiments, when an NMOS transistor is formed on the substrate 102, the substrate 102 may be formed of one from among the above-described Group III-V materials. In some embodiments, when a PMOS transistor is formed on the substrate 102, at least a portion of the substrate 102 may include Ge. In some embodiments, the substrate 102 may have a silicon on insulator (SOI) structure. The substrate 102 may include a conductive region, for example, a well doped with an impurity or a structure doped with an impurity.

The plurality of sacrificial semiconductor layers 106S and the plurality of nano-sheet semiconductor layers NS may include different semiconductor materials. In some embodiments, the sacrificial semiconductor layers 106S may include SiGe, and the nano-sheet semiconductor layers NS may include Si. However, embodiments of inventive concepts are not limited thereto.

In some embodiments, the thickness of the sacrificial semiconductor layer 106S that is closest to the substrate 102, among the plurality of sacrificial semiconductor layers 106S, may be greater than the thicknesses of the other sacrificial semiconductor layers 106S. However, embodiments of inventive concepts are not limited thereto. For example, the plurality of sacrificial semiconductor layers 106S may have the same thicknesses.

Next, a mask pattern MP is formed on a stack structure of the plurality of sacrificial semiconductor layers 106S and the plurality of nano-sheet semiconductor layers NS. The mask pattern MP may include a pad oxide layer pattern MP1 and a hard mask pattern MP2. The hard mask pattern MP2 may include a silicon nitride, polysilicon, a spin-on hard mask (SOH) material, or a combination thereof. However, embodiments of inventive concepts are not limited thereto. In some embodiments, the SOH material may be composed of a hydrocarbon compound having a comparatively high content of carbon of about 85 weight percent (wt %) to about 99 wt % based on a total weight of the SOH material, or a derivative thereof.

A plurality of first trenches T1 are formed by etching the stack structure of the plurality of sacrificial semiconductor layers 106S and the plurality of nano-sheet semiconductors NS and a portion of the substrate 102 using the mask pattern MP as an etching mask. As a result, a plurality of fin-type active regions FA may be formed and defined by the plurality of first trenches T1. After the plurality of fin-type active regions FA are formed, the stack structure of the plurality of sacrificial semiconductor layers 106S and the plurality of nano-sheet semiconductor layers NS remains on the plurality of fin-type active regions FA.

An STI layer 114 is formed within the plurality of first trenches T1. The STI layer 114 may include a trench insulating liner 114A that covers an inner wall of the first trench T1 conformally and a gap fill insulating layer 114B on the trench insulating liner 114A so as to fill the first trench T1.

In some embodiments, the trench insulating liner 114A that covers the inner wall of the first trench T1 may include an oxide layer, silicon nitride (SiN), silicon oxynitride (SiON), silicon boronitride (SiBN), silicon carbide (SiC), SiC:H, SiCN, SiCN:H, SiOCN, SiOCN:H, silicon oxycarbide (SiOC), silicon dioxide ($SiO_2$), polysilicon, or a combination thereof. In some embodiments, the trench insulating liner 114A may have a thickness of about 10 to about 100 Å.

In some embodiments, the gap fill insulating layer 114B may include an oxide layer. In some embodiments, the gap fill insulating layer 114B may include an oxide layer formed by a deposition process or a coating process. In some embodiments, the gap fill insulating layer 114B may include an oxide layer formed by a flowable chemical vapor deposition (FCVD) process or a spin coating process.

For example, the gap fill insulating layer 114B may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ). However, embodiments of inventive concepts are not limited thereto.

Subsequently, a portion of structures is etched from a resultant structure in which the fin-type active region FA and the STI layer 114 are formed, thereby forming a second trench T2 for defining the device region DR, as illustrated in FIGS. 1 through 3, and forming the isolation layer 116 within the second trench T2.

Figure 9:
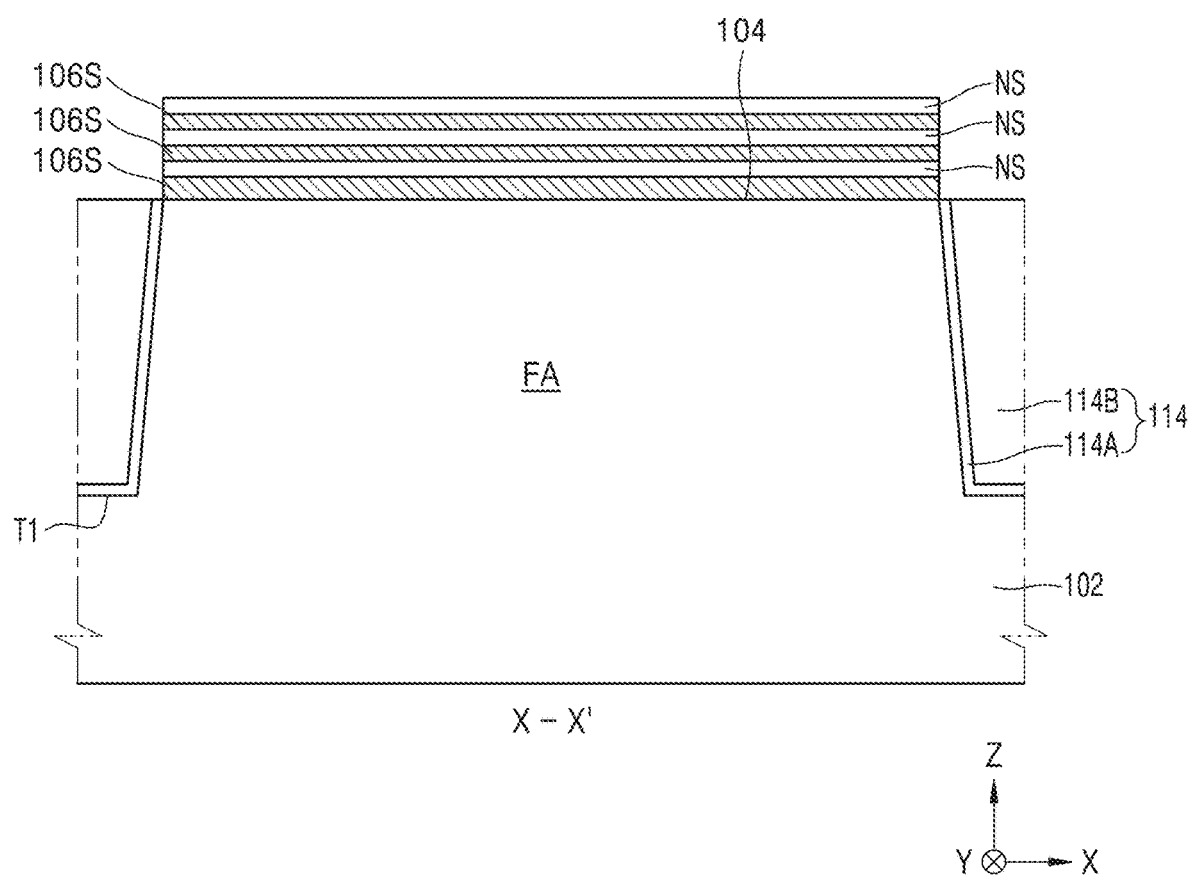

Referring to FIG. 9, the mask pattern MP that remains on the stack structure of the plurality of sacrificial semiconductor layers 106S and the plurality of nano-sheet semiconductor layers NS is removed, and a recess process is performed so as to remove a portion of thicknesses of the STI layer 114 and the isolation layer 116 from upper portions thereof.

The recess process may be performed so that a top surface of each of the STI layer 114 and the isolation layer 116 may be at approximately the same as or a similar level to that of the top surface 104 of the fin-type active region FA. As a result, sidewalls of the stack structure of the plurality of sacrificial semiconductor layers 106S and the plurality of nano-sheet semiconductor layers NS on the plurality of fin-type active regions FA may be exposed. In order to perform the recess process, an etching process, such as dry etching, wet etching, or a combination of drying etching and wet etching may be used.

Figure 10:
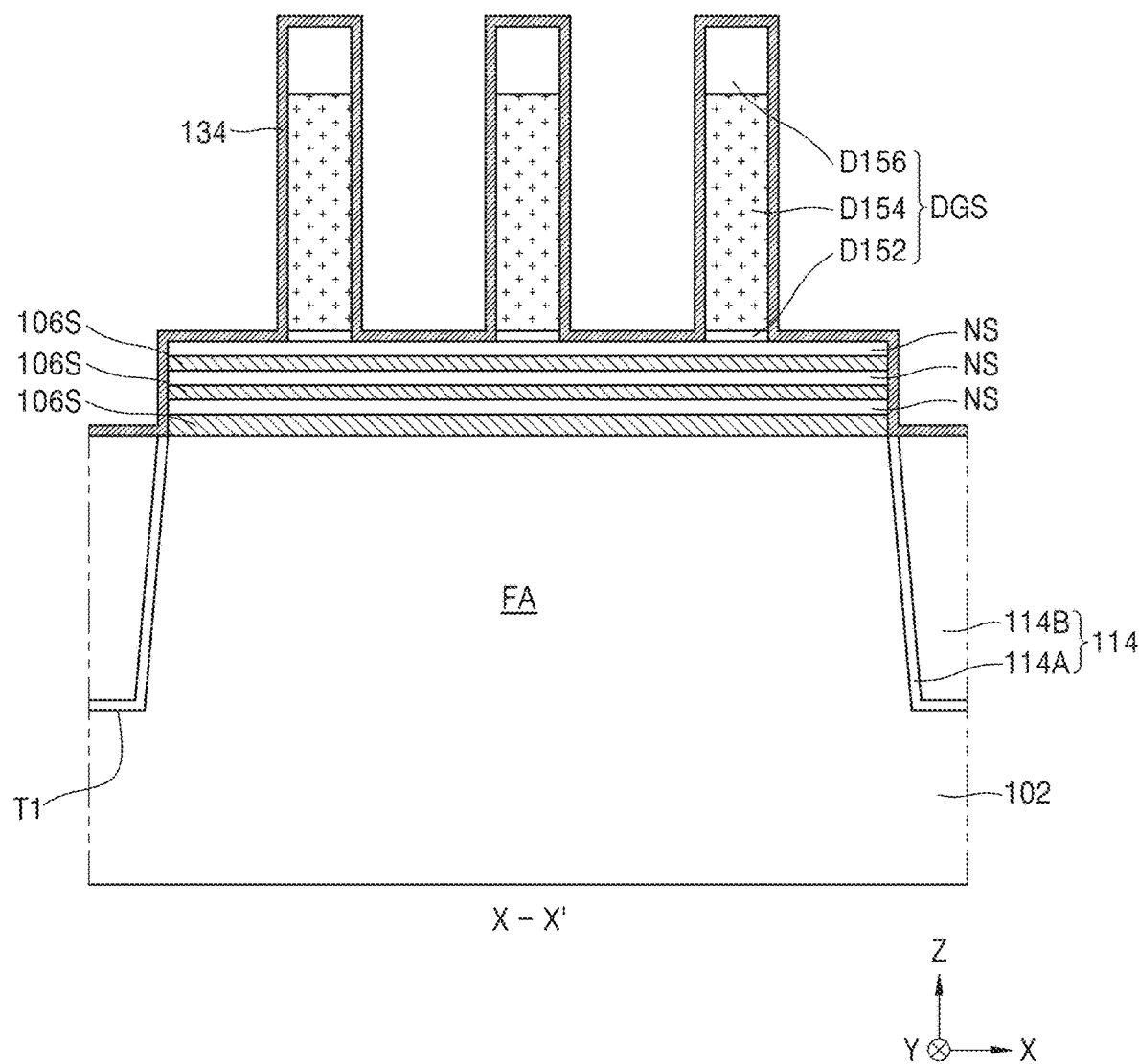

Referring to FIG. 10, a plurality of dummy gate structures DGS are formed on the plurality of fin-type active regions FA to cross the plurality of fin-type active regions FA and to extend thereon. The plurality of dummy gate structures DGS may have a structure in which an oxide layer D152, a dummy gate layer D154 and a capping layer D156 are sequentially stacked.

In an example in which the dummy gate structures DGS are formed, the oxide layer D152, the dummy gate layer D154, and the capping layer D156 are sequentially formed so as to cover the exposed surface of the stack structure of the plurality of sacrificial semiconductor layers 106S and the plurality of nano-sheet semiconductor layers NS that cover the plurality of fin-type active regions FA, the top surface of the STI layer 114, and the top surface of the isolation layer 116 and then are patterned so that the oxide layer D152, the dummy gate layer D154, and the capping layer D156 may remain only in necessary portions of the dummy gate structure DGS.

The dummy gate structure DGS may have a planar shape corresponding to the gate 150 illustrated in FIG. 1. In some embodiments, the dummy gate layer D154 may include polysilicon, and the capping layer D156 may include a silicon oxide layer. However, embodiments of inventive concepts are not limited thereto.

Next, the gate insulating liner 134 is formed to cover the exposed surface of the dummy gate structure DGS, the exposed surface of the stack structure of the plurality of sacrificial semiconductor layers 106S and the plurality of nano-sheet semiconductor layers NS, and the top surface of each of the STI layer 114 and the isolation layer 116. In some embodiments, the gate insulating liner 134 may include a silicon nitride layer.

Figure 11:
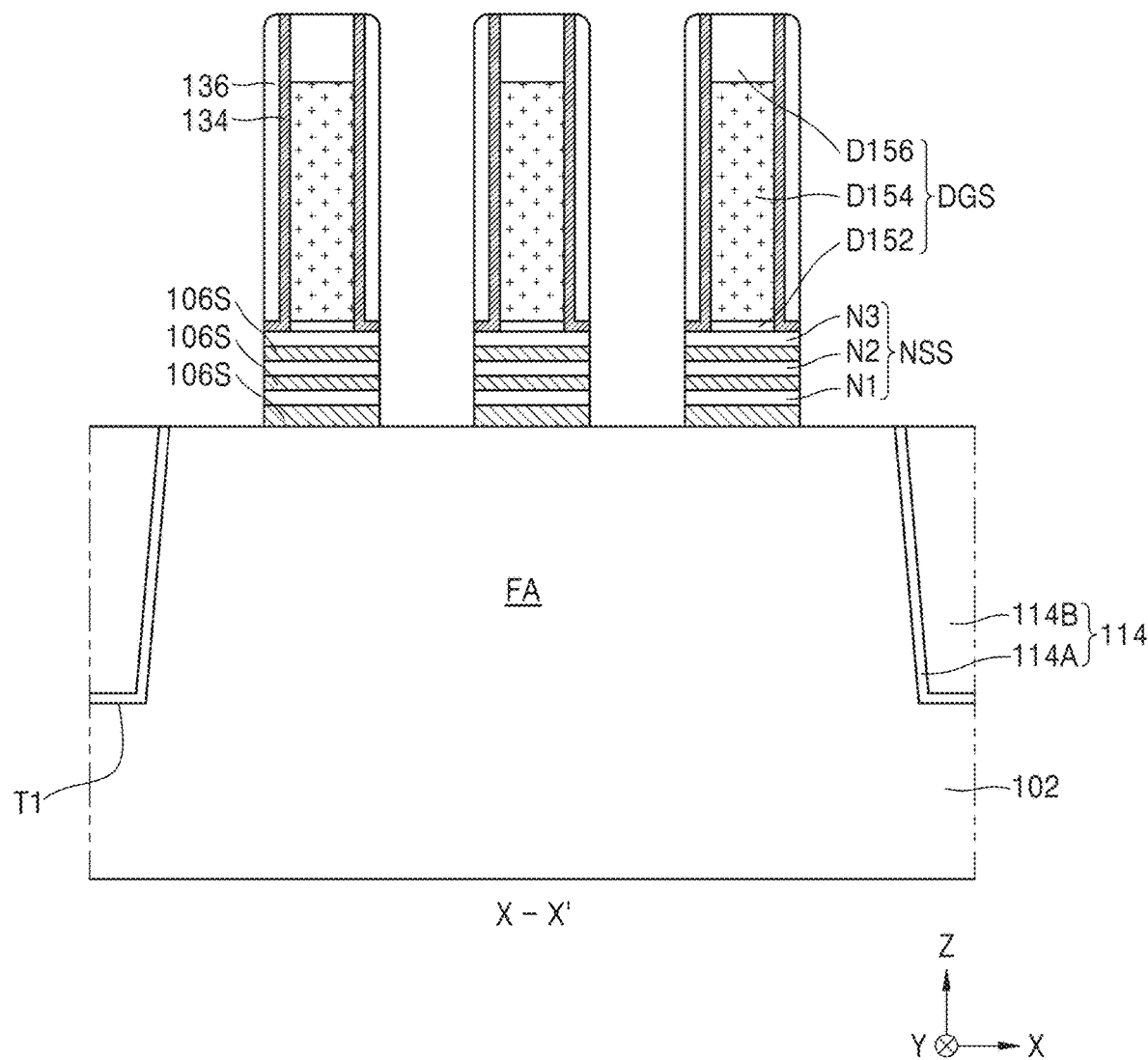

Referring to FIG. 11, the outer spacer 136 is formed to cover both sidewalls of the dummy gate structure DGS, and the stack structure of the plurality of sacrificial semiconductor layers 106S and the plurality of nano-sheet semiconductor layers NS is removed by etching using the dummy gate structure DGS and the outer spacer 136 as an etching mask so that nano-sheet stack structures NS S including a plurality of nano-sheets N1, N2, and N3 may be formed.

In order to form the outer spacer 136, after a spacer layer including a silicon nitride layer is formed on the resultant structure of FIG. 10 having the gate insulating liner 134 formed therein, the spacer layer may be etched back so that the outer spacer 136 may remain.

In some embodiments, when the stack structure of the plurality of sacrificial semiconductor layers 106S and the plurality of nano-sheet semiconductor layers NS is etched, a point in time when the substrate 102 is exposed, is used as an etching ending point so that the etching process can be performed.

Figure 12:
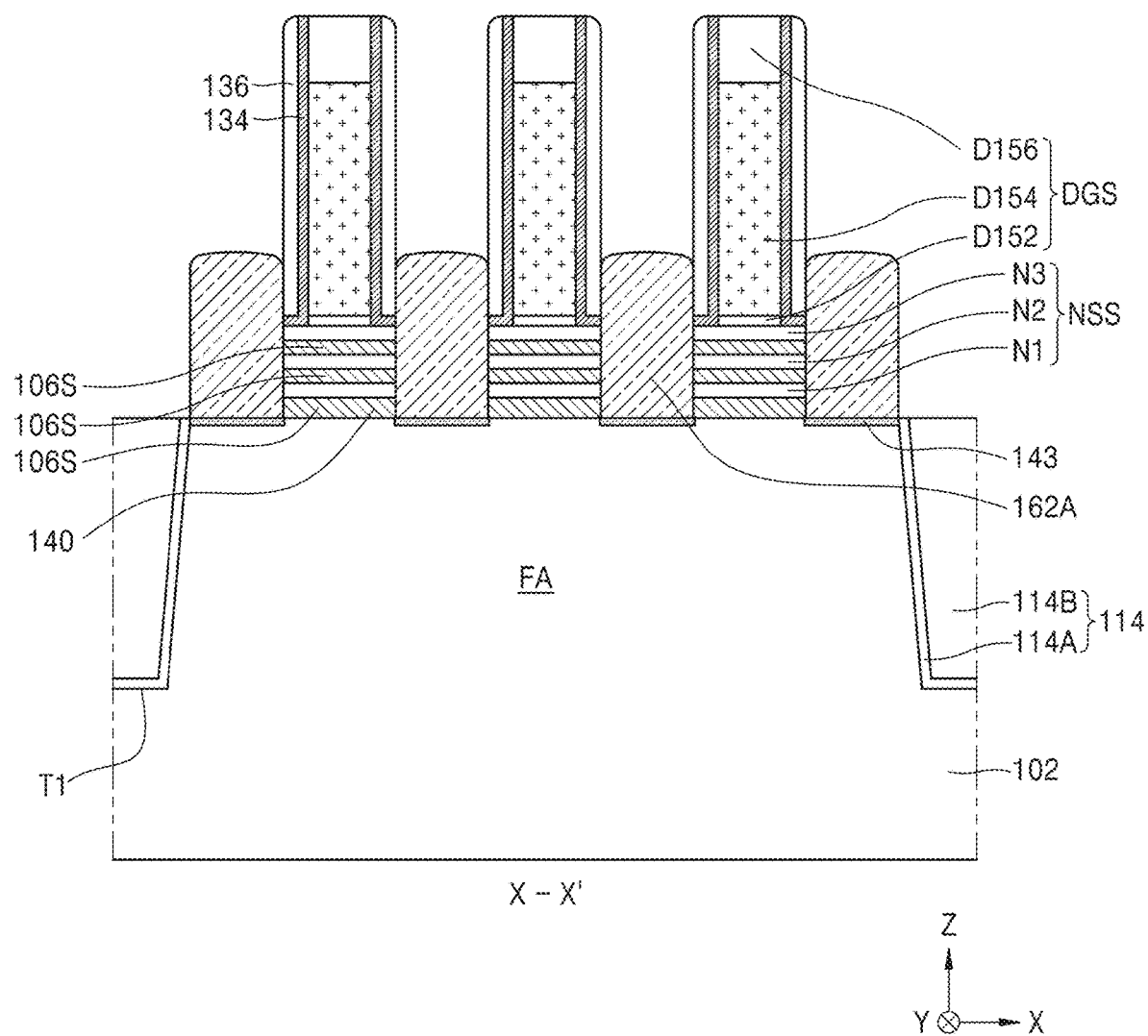

Referring to FIG. 12, a source/drain protection layer 143 is formed on a top surface of the fin-type active region FA at one sidewall of the plurality of nano-sheets N1, N2, and N3. The source/drain protection layer 143 may be a re-grown layer re-grown by an epitaxial growth method. In some embodiments, the source/drain protection layer 143 may be a silicon layer or an impurity-undoped silicon layer. The source/drain protection layer 143 may be a semiconductor layer for protecting the source/drain regions (see 162 of FIGS. 1 through 3) in a subsequent manufacturing process, for example, in the etching process.

Subsequently, both exposed sidewalls of the plurality of nano-sheets N1, N2, and N3 and the exposed surface of the substrate 102 are cleaned, thereby removing a natural oxide layer.

Subsequently, a semiconductor material is epitaxially grown from both exposed sidewalls of the plurality of nano-sheets N1, N2, and N3 and the surface of the substrate 102, thereby forming a semiconductor layer 162A for forming the source/drain regions (see 162 of FIG. 2). The outer spacer 136 may be formed as an insulating layer in which it is not possible to perform seeding and epitaxial growth of semiconductor atoms, on a surface thereof. Thus, the epitaxial growth process for forming the semiconductor layer 162A may be performed only from both exposed sidewalls of the plurality of nano-sheets N1, N2, and N3 and the exposed surface of the substrate 102.

Figure 13:
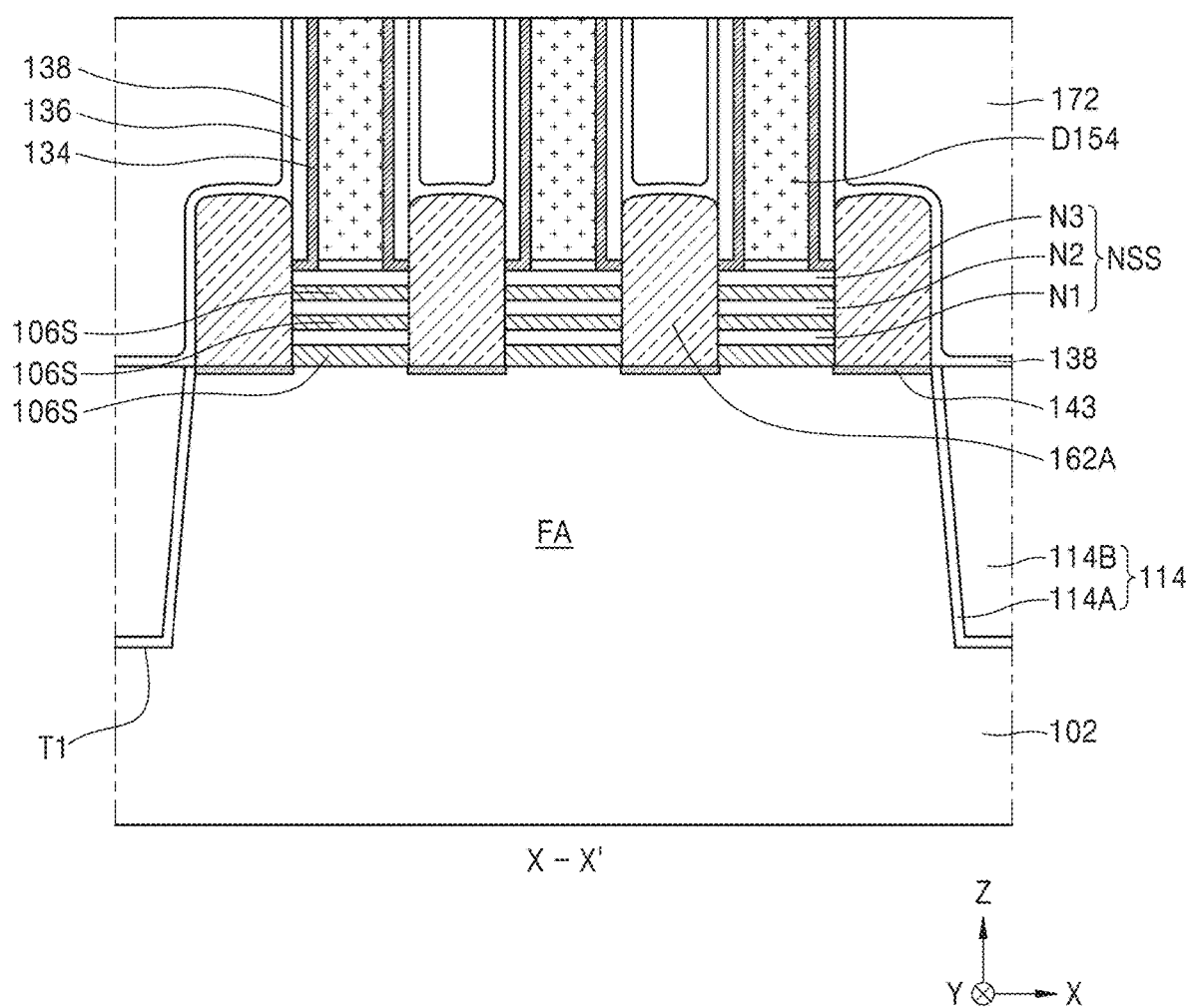

Referring to FIG. 13, a gate protection layer 138 that covers the resultant structure having the semiconductor layer 162A formed therein, is formed. In some embodiments, the gate protection layer 138 may include a silicon oxide layer. In order to form the gate protection layer 138, an atomic layer deposition (ALD) process or a CVD process may be used.

After an inter-gate insulating layer 172 is formed on the gate protection layer 138, the inter-gate insulating layer 172 is planarized so that the top surface of the capping layer (see D156 of FIG. 11) is exposed. Subsequently, the capping layer D156, the gate insulating liner 134, the outer spacer 136, and the gate protection layer 138, which are disposed around the capping layer D156, are etched back, and a portion of a thickness the inter-gate insulating layer 172 is polished from an upper portion thereof so that the top surface of the inter-gate insulating layer 172 is disposed at approximately the same level as a level of the top surface of the dummy gate layer D154.

Figure 14:
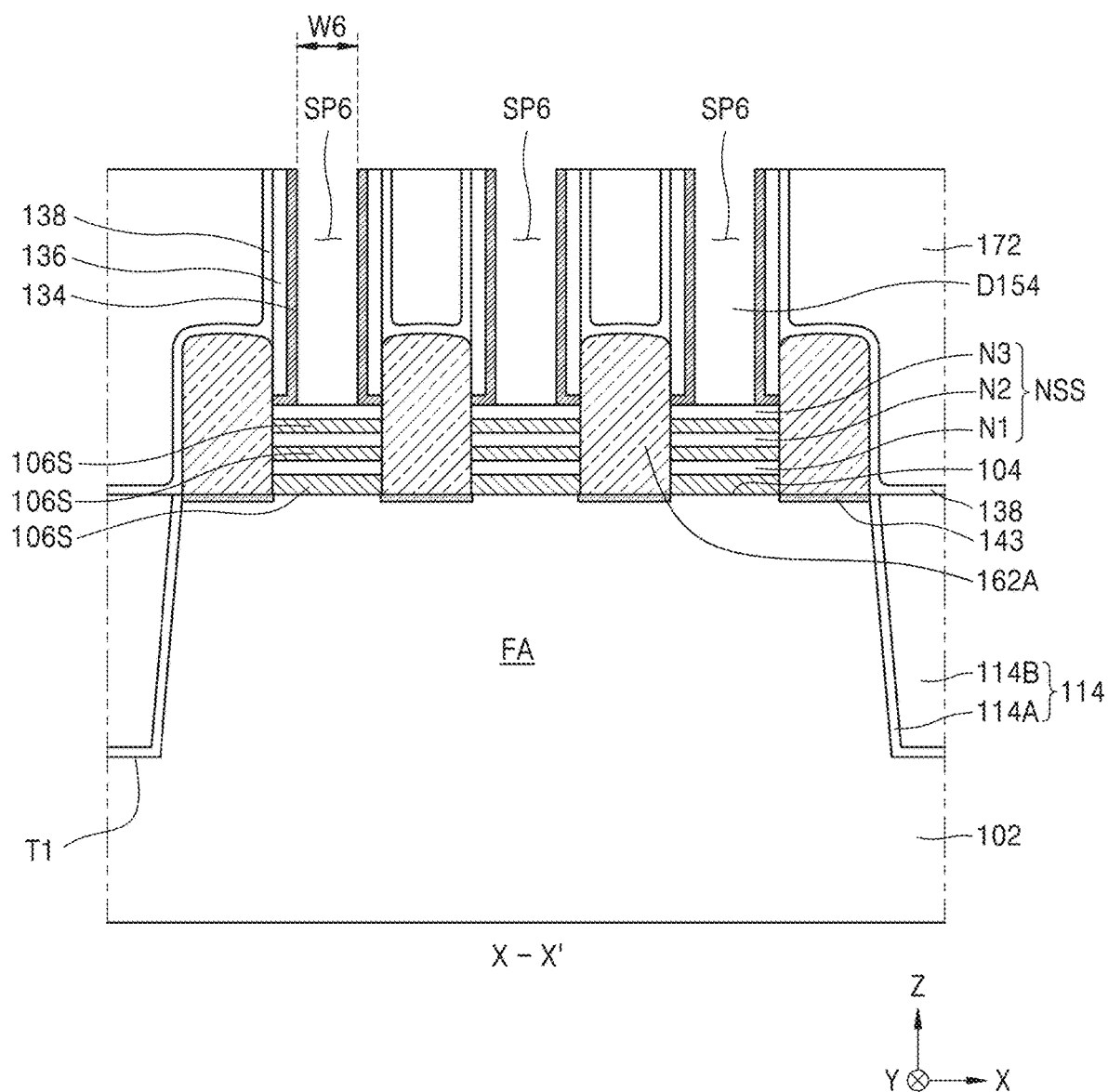

Referring to FIG. 14, the dummy gate layer D154 exposed through the inter-gate insulating layer 172 and the oxide layer D152 below the dummy gate layer D154 are removed, forming a gate structure space SP6. The gate insulating liner 134 and the nano-sheet N3 may be exposed through the gate structure space SP6.

A wet etching process may be used to remove the dummy gate layer D154 and the oxide layer D152 below the dummy gate layer D154. While the wet etching process is performed, a pair of gate insulating liners 134 for defining the width W6 of the gate structure space SP6 may be exposed to an etchant. The gate insulating liner 134 is formed of a material having comparatively high carbon content and thus has excellent resistance to the etchant.

Thus, even when the gate insulating liner 134 is exposed to the etchant, the gate insulating liner 134 may not be substantially consumed by the etchant but may remain. Thus, a desired (and/or alternatively predetermined) width W6 of the gate structure space SP6 may be maintained.

Figure 15:
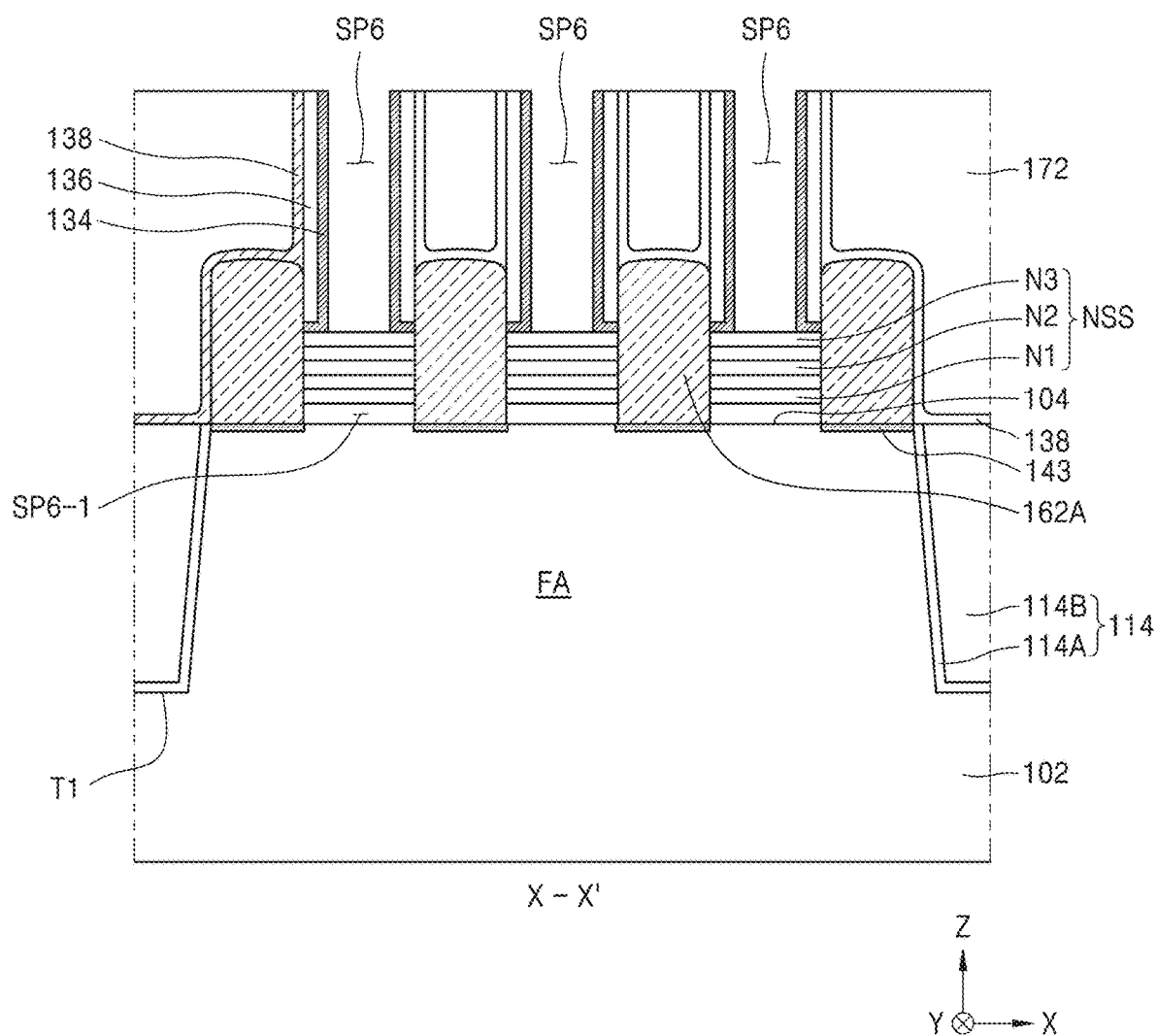

Referring to FIG. 15, the plurality of sacrificial semiconductor layers 106S that remain in the fin-type active regions FA are removed through the gate structure space SP6, so that portions of the nano-sheets N1, N2, and N3 and the top surface 104 of the fin-type active region FA are exposed through the gate structure space SP6. A gate structure space SP6-1 may be formed between the nano-sheets N1, N2, and N3.

A wet etching process may be used to remove the sacrificial semiconductor layer 106S through the gate structure space SP6. Furthermore, although this will be described in more detail, a possibility that the semiconductor layer 162A during wet etching may be damaged by the source/drain protection layer 143, may be reduced.

Figure 16:
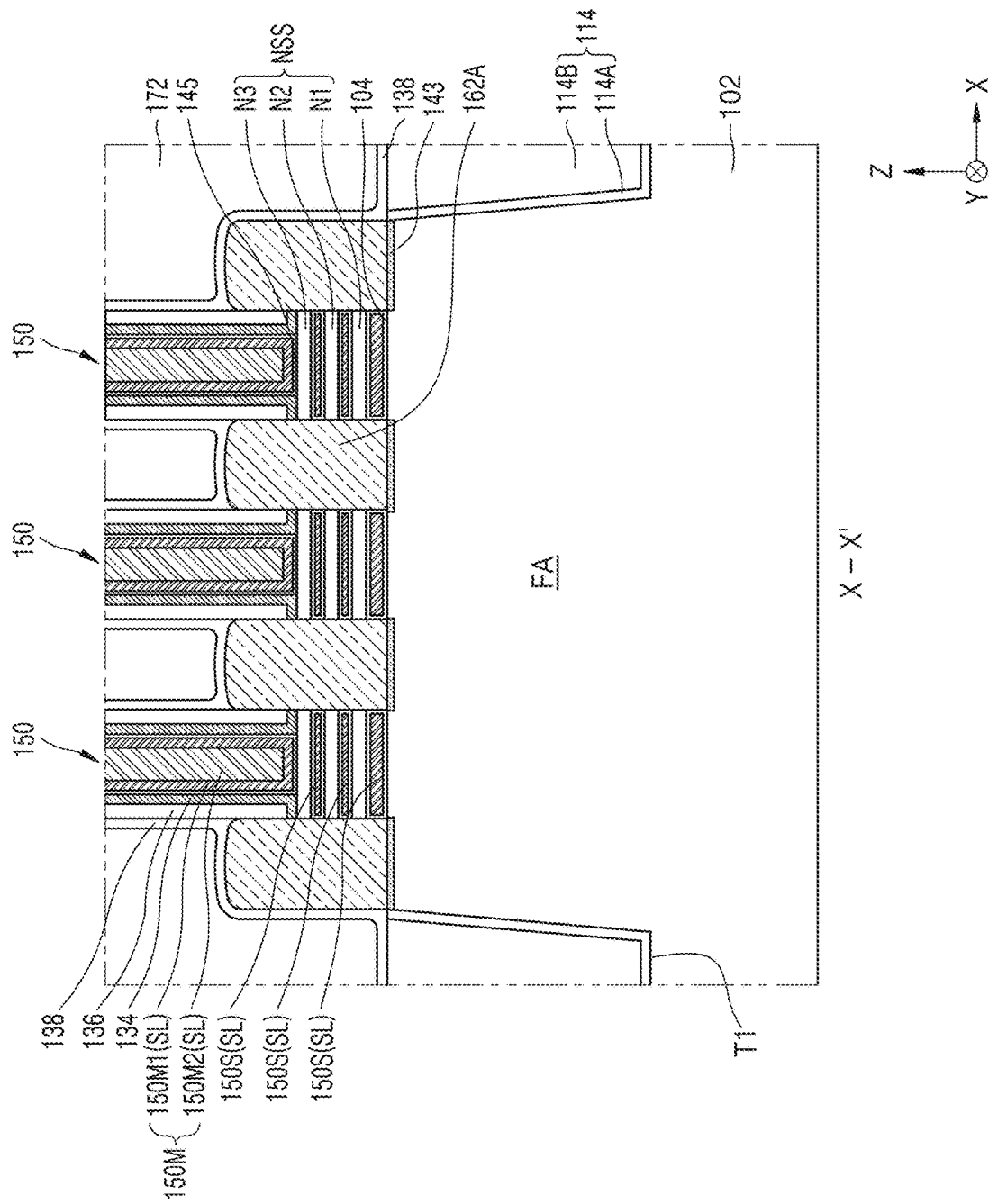
Figure 18:
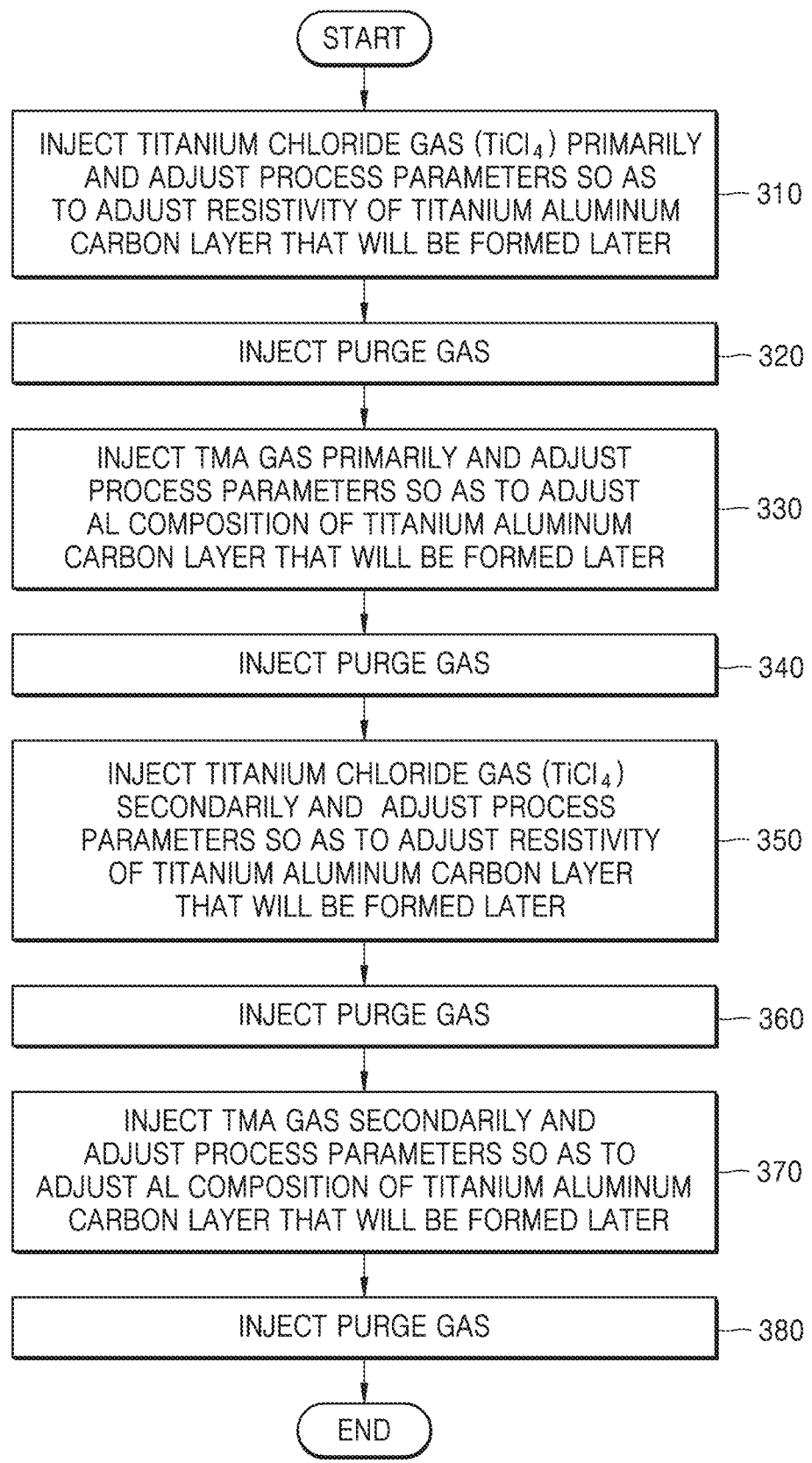
FIG. 18 is a flowchart illustrating a method of manufacturing a gate of the semiconductor device according to some embodiments of inventive concepts using FIG. 17.

Referring to FIG. 16, after the natural oxide layer is removed from the exposed surface of the plurality of nano-sheets N1, N2, and N3 and the fin-type active regions FA, a gate insulating layer 145 is formed on exposed surfaces in the gate structure spaces (see SP6 and SP6-1 of FIG. 18).

The gate insulating layer 145 may have a stack structure of an interfacial layer and a high-dielectric layer. The interfacial layer may cure an interfacial defect between high-dielectric layers on a top surface of each of the fin-type active regions FA and surfaces of the plurality of nano-sheets N1, N2, and N3.

In some embodiments, the interfacial layer may include a low-dielectric material layer having a dielectric constant of about 9 or less, for example, a silicon oxide layer, a silicon oxynitride layer, a Ga oxide layer, a Ge oxide layer, or a combination thereof. In some embodiments, the interfacial layer may include silicate, a combination of silicate and a silicon oxide layer, or a combination of silicate and a silicon oxynitride layer. In some embodiments, the interfacial layer may be omitted.

The high-dielectric layer may be formed of a material having a higher dielectric constant than a dielectric constant of the silicon oxide layer. For example, the high-dielectric layer may have a dielectric constant of about 10 to about 25. The high-dielectric layer may be formed of a material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof. However, the material for forming the high-dielectric layer is not limited to the above example. The high-dielectric layer may be formed by an ALD process, a CVD process, or a physical vapor deposition (PVD) process. The high-dielectric layer may have a thickness of about 10 to about 40 Å. However, embodiments of inventive concepts are not limited thereto.

A gate 150 that covers an inter-gate insulating layer 1 while filling the gate structure spaces SP6 and SP6-1 on the gate insulating layer 145, is formed. The gate 150 may include a main gate portion 150M that covers a top surface of a nano-sheet stack structure NSS including the plurality of nano-sheets N1, N2, and N3, and sub-gate portions 150S connected to the main gate portion 150M and formed in a space between the nano-sheets N1, N2, and N3.

A barrier metal layer 150M1 that constitutes the gate 150, e.g., the sub-gate portions 150S and the main gate portion 150M, may include a single metal layer SL having different compositions of metal atoms of a surface and an inside thereof, as described above.

In some embodiments, the single metal layer SL may include TiAl, TiAlC, or TiAlN. The single metal layer SL may have different compositions of the metal atoms, for example, Ti or Al of the surface and the inside thereof, as described above.

As described above, the main gate portion 150M may include a main metal layer 150M2. The main metal layer 150M2 may include a gap-fill metal layer for filling an inside space of the barrier metal layer 150M1. The main metal layer 150M2 may be formed using an ALD process.

Subsequently, as illustrated in FIG. 2, after an interlayer insulating layer 174 that covers the gate 150 and the inter-gate insulating layer 172 is formed, a portion of the interlayer insulating layer 174 and the inter-gate insulating layer 172 is etched so that a plurality of contact holes for exposing the plurality of semiconductor layers 162A are formed. Subsequently, a metal silicide layer 162B is formed on top surfaces of the plurality of semiconductor layers 162A exposed through the plurality of contact holes, and a plurality of contact plugs 190 are formed to be connected to the semiconductor layers 162A through the metal silicide layer 162B, thereby forming the semiconductor device 100 illustrated in FIGS. 1 through 3.

Figure 17:
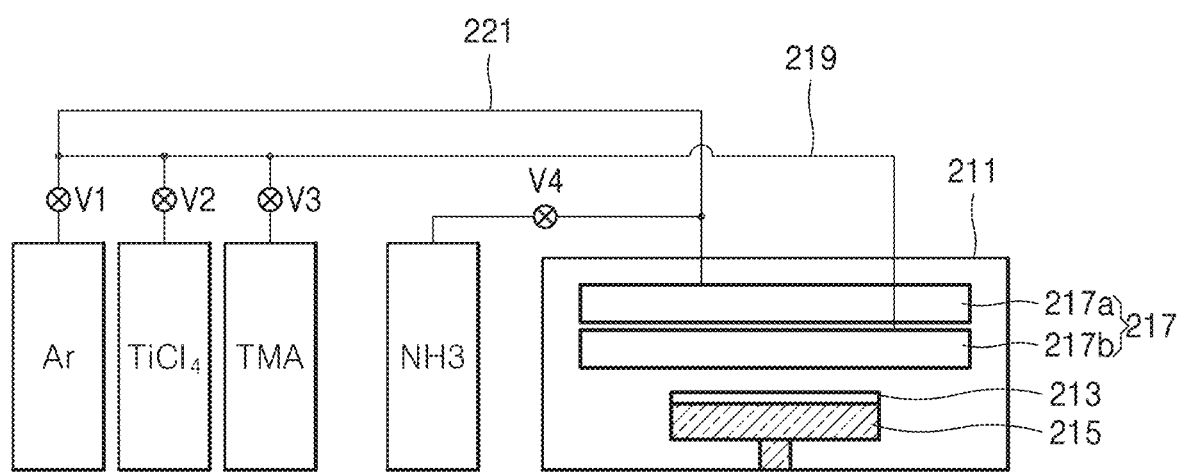
FIG. 17 is a schematic view illustrating a thin film-forming device used to manufacture the semiconductor device according to some embodiments of inventive concepts.

FIG. 17 is a schematic view illustrating a thin film-forming device used to manufacture the semiconductor device according to some embodiments of inventive concepts.

In detail, FIG. 17 is a view for explaining a thin film-forming device for forming a single metal layer that constitutes the above-described sub-gate portions 150S and the barrier metal layer 150MS, for example, an aluminum carbon layer or a titanium aluminum nitride layer. The thin film-forming device of FIG. 17 may be an ALD device.

The thin film-forming device used to manufacture the semiconductor device according to some embodiments of inventive concepts may include a reaction chamber 211 that may be heated by an external heater (not shown), a substrate 213, a susceptor 215 installed on a bottom of the reaction chamber 211 so that a silicon substrate may be put on the susceptor 215, and a shower head 217 installed above the susceptor 215 so that source gases (reaction gases and process gases) may be injected into the reaction chamber 111. A vacuum pump (not shown) may be connected to the reaction chamber 211 so as to adjust pressure inside the reaction chamber 211.

The shower head 217 may include a first shower head 217a and a second shower head 217b. Two shower heads 217 are provided, or one shower head 217 may also be provided. A first gas inlet 221 may be connected to the first shower head 217a, and a second gas inlet 219 may be connected to the second shower head 217b. The first gas inlet 221 is used to inject a nitrogen source, for example, an ammonia gas into the reaction chamber 211. The second gas inlet 219 may be used to inject a titanium source, for example, a titanium chloride gas, and an aluminum source, for example, TMA, into the reaction chamber 211.

The first gas inlet 221 or the second gas inlet 219 may inject an argon (Ar) gas that is an inert gas, into the reaction chamber 211. Injection of the Ar gas, the titanium chloride gas, TMA, and the ammonia gas into the reaction chamber 21 may be controlled by a first valve V1, a second valve V2, a third valve V3, and a fourth valve V4, respectively.

Figure 19:
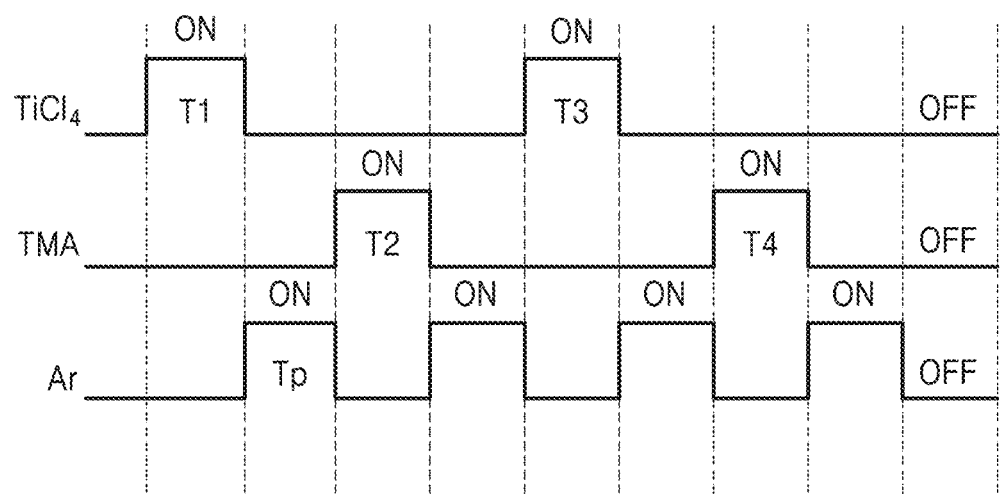
FIG. 19 is a view for explaining an injection order of source gases used to manufacture the gate of the semiconductor device according to some embodiments of inventive concepts using 17.

FIG. 18 is a flowchart illustrating a method of manufacturing a gate of the semiconductor device according to some embodiments of inventive concepts using the thin film-forming device of FIG. 17, and FIG. 19 is a view for explaining an injection order of source gases used to manufacture the gate of the semiconductor device according to some embodiments of inventive concepts using the thin film-forming device of FIG. 17.

In detail, FIG. 18 is a flowchart illustrating a process of forming a single metal layer, for example, a titanium aluminum carbon layer that constitutes the sub-gate portions 150S and the barrier metal layer 150M1 using ALD using the thin-film forming device of FIG. 17, and FIG. 19 is a view illustrating the injection order of the source gases when the single metal layer of FIG. 18, for example, the titanium aluminum carbon layer, is formed.

The reaction chamber 211 is maintained at a desired (and/or alternatively predetermined) pressure, for example, several Torr of 1-9, and the process temperature of the reaction chamber 211 is maintained at 300 to 600° C., for example, 450° C. Under this process condition, a titanium source, for example, a titanium chloride gas, is primarily injected into the reaction chamber 211 including the substrate 213, for example, a silicon substrate for a time T1 (Operation 310). The time T1 when the titanium source is injected, is 1 to 10 seconds, for example, and an injection amount is 10 to 90 sccm. By adjusting the primary injection time and the injection amount of the titanium source, resistivity of a titanium aluminum carbon layer $Ti_{1-x}Al_xC$ that will be formed later may be adjusted. Subsequently, the Ar gas that is a purge gas is injected into the reaction chamber 211 for a time Tp so that unreacted source gases may be purged (Operation 320). The purge amount of the Ar gas is adjusted to several hundreds, for example, 500 sccm.

An aluminum source, for example, $TMA(Al(CH_3)_3)$, is primarily injected into the reaction chamber 211 into which the titanium source is injected, for a time T2 (Operation 330). The time T2 when the aluminum source is injected, is a time when the Ar gas of several hundreds, for example, 200 sccm is bubbled in a TMA solution for several seconds, for example, 1 to 10 seconds and then is injected into the reaction chamber 211. Thus, the aluminum source is decomposed from the surface of titanium so that a titanium aluminum carbon layer may be formed. By adjusting the primary injection time and the injection amount of the aluminum source, an Al composition of the titanium aluminum carbon layer ($Ti_{1-x}Al_xC$) that will be formed later may be adjusted. Subsequently, the Ar gas that is the purge gas is injected into the reaction chamber 211 so that unreacted source gases may be purged (Operation 340). The purge amount of the Ar gas is adjusted to several hundreds, for example, 500 sccm.

Subsequently, a titanium source, for example, a titanium fluoride gas is secondarily injected into the reaction chamber 211 including the substrate 213, for example, the silicon substrate for a time T3 (Operation 350). The time T3 may be the same as the time T1. By adjusting the secondary injection time and the injection amount of the titanium source, resistivity of the titanium aluminum carbon layer (Ti1-xAlxC) that will be formed later may be adjusted. Subsequently, the Ar gas that is a purge gas is injected into the reaction chamber 211 so that unreacted source gases may be purged (Operation 360).

Subsequently, the aluminum source, for example, TMA (Al(CH$_3$)$_3$) is secondarily injected into the reaction chamber 211 into which the titanium source is injected, for a time T4 (Operation 370). The time T4 may be the same as the time T2. By adjusting the secondary injection time and the injection amount of the aluminum source, an Al composition of the titanium aluminum carbon layer (Ti$_{1-x}$Al$_x$C) that will be formed later is adjusted. Subsequently, the Ar gas that is the purge gas is injected into the reaction chamber 211 so that unreacted source gases may be purged (Operation 380).

In this way, injecting of the titanium source (Operation 310), injecting of the purge gas (Operation 320), injecting of the aluminum source (Operation 330), and injecting of the purge gas (Operation 340) may be performed in one cycle so that the titanium aluminum carbon layer may be formed. Furthermore, resistivity or a work function of the single metal layer, for example, a titanium aluminum carbon layer that constitutes the sub-gate portions 150S and the barrier metal layer 150M1 of the semiconductor device according to some embodiments of inventive concepts may be adjusted by control of process parameters, for example, the number of cycles, the injection amount of the source gas, an injection time, a pressure, and a temperature of a process chamber.

For example, an Al composition X of the single metal layer, for example, a titanium aluminum carbon layer (Ti$_{1-x}$Al$_x$C) that constitutes the sub-gate portions 150S and the barrier metal layer 150M1 of the semiconductor device, may be adjusted to 0<X<0.5. Thus, a work function of the single metal layer that constitutes the sub-gate portions 150S and the barrier metal layer 150M1 of the semiconductor device may be adjusted.

Figure 20:
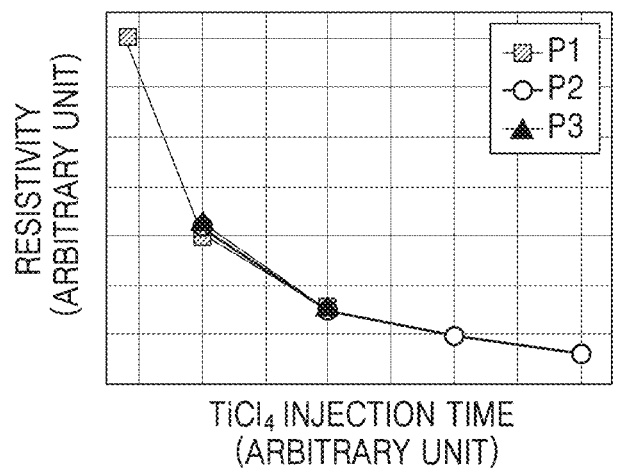
FIG. 20 is a graph showing a resistivity change according to a pulse time of a process gas when the gate of the semiconductor device according to some embodiments of inventive concepts is manufactured using FIG. 17.

FIG. 20 is a graph showing a resistivity change according to a pulse time of a process gas when the gate of the semiconductor device according to some embodiments of inventive concepts is manufactured using the thin film-forming device of FIG. 17.

In detail, FIG. 20 is a graph of resistivity with respect to an injection time of a titanium chloride gas that is a titanium gas when a single metal layer that constitutes sub-gate portions 150S and a barrier metal layer 150M1 of a semiconductor device, for example, a titanium aluminum carbon layer (Ti$_{1-x}$Al$_x$C) is formed. The X-axis represents a time T1 or T3, and the Y-axis represents a resistivity value.

As illustrated in FIG. 20, resistivity of the titanium aluminum carbon layer formed as the injection time of the titanium chloride gas that is the titanium source is increased, may be reduced. In FIG. 20, the pressure of a reaction chamber is increased in the order of P1, P2, and P3. P1, P2, and P3 is several Torrs of 1 to 9.

In this way, when the single metal layer that constitutes the sub-gate portions 150S and the barrier metal layer 150M1 of the semiconductor device, for example, the titanium aluminum carbon layer (Ti1-xAlxC) is formed, the injection time of the titanium chloride gas that is the titanium source is adjusted so that resistivity may be adjusted.

Figure 21:
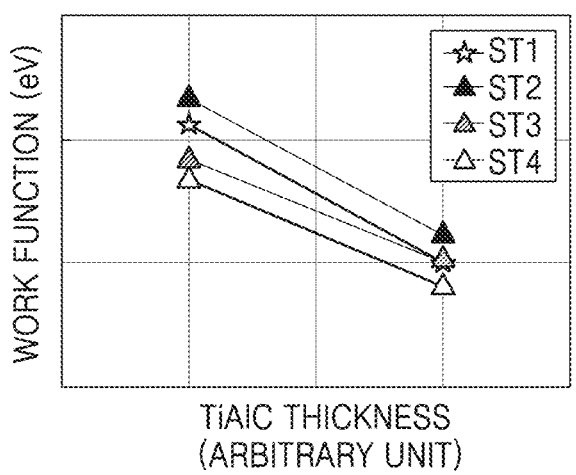
FIG. 21 is a graph showing a work function change according to the thickness of the gate when the gate of the semiconductor device according to some embodiments of inventive concepts is manufactured using the thin film-forming device of FIG. 17.

FIG. 21 is a graph showing a work function change according to the thickness of the gate when the gate of the semiconductor device according to some embodiments of inventive concepts is manufactured using the thin film-forming device of FIG. 17.

In detail, FIG. 21 is a graph showing a change in a work function with respect to an injection time of TMA(Al(CH$_3$)$_3$) that is an aluminum source when a single metal layer that constitutes the sub-gate portions 150S and the barrier metal layer 150M1 of the semiconductor device, for example, a titanium aluminum carbon layer (Ti$_{1-x}$Al$_x$C) is formed. The X-axis represents a thickness of the titanium aluminum carbon layer (Ti$_{1-x}$Al$_x$C), and the Y-axis represents a work function value. In FIG. 21, the injection time of TMA(Al(CH$_3$)$_3$) that is the aluminum source is increased in the order of ST1, ST2, ST3, and ST4. ST1, ST2, ST3, and ST4 may be an injection time of several seconds, for example, 1 to 10 seconds.

As illustrated in FIG. 21, as the injection time of TMA (Al(CH$_3$)$_3$) that is the aluminum source is increased when the thickness of the titanium aluminum carbon layer (Ti$_{1-x}$Al$_x$C) is fixed, a work function of the titanium aluminum carbon layer may be reduced. In this way, when the single metal layer that constitutes the sub-gate portions 150S and the barrier metal layer 150M1 of the semiconductor device, for example, the titanium aluminum carbon layer (Ti$_{1-x}$Al$_x$C) is formed, the injection time of TMA(Al(CH$_3$)$_3$) that is the aluminum source is adjusted so that a work function of TMA(Al(CH$_3$)$_3$) may be adjusted.

As described above, a semiconductor device according to an inventive concept includes a gate disposed above or below a nano-sheet and including a single metal layer having different compositions of metal atoms of a surface and an inside thereof.

Thus, in the semiconductor device according to some embodiments of inventive concepts, the compositions of the metal atoms of the surface and the inside of the single metal layer that constitutes the gate are adjusted so that resistivity of the gate may be reduced, and a work function may be changed so that the semiconductor device may have a threshold voltage with various amplitudes (values).

While inventive concepts has been particularly shown and described with reference to embodiments thereof, it will be understood that various changes in form and details may be made therein without departing from the spirit and scope of the following claims.

What is claimed is:

1. A semiconductor device comprising:
   a substrate;
   a fin-type active region in the substrate;
   a plurality of nano-sheets on the fin-type active region, the plurality of nano-sheets including a nano-sheet on the substrate, the nano-sheet spaced apart from a top surface of the fin-type active region, the nano-sheet including a channel region;
   a gate above the nano-sheet, the gate including a single metal layer having different compositions of metal atoms at a top surface and a bottom surface thereof,
      a top surface of the gate being a top portion of the single metal layer,
      a bottom surface of the gate being a bottom portion of the single metal layer, and
      a composition of the metal atoms of the gate being increased from the bottom portion of the single metal layer of the gate to the top portion of the single metal layer of the gate or from the top portion of the single metal layer of the gate to the bottom portion of the single metal layer of the gate;
   a gate insulating layer between the nano-sheet and the gate;
   source/drain regions on the fin-type active region at both sides of the nano-sheet; and
   a sub-gate is between the plurality of nano-sheets, wherein
   the sub-gate includes a solo metal layer having different compositions of metal atoms at a top surface and a bottom surface thereof,
   the top surface of the sub-gate being a top portion of the solo metal layer, the bottom surface of the sub-gate being a bottom portion of the solo metal layer, the solo metal layer of the sub-gate includes base metal atoms and combination metal atoms combined to the base metal atoms, and a composition of the combination metal atoms is gradually increased from the bottom portion of the solo metal layer to the top portion of the solo metal layer or from the top portion of the solo metal layer to the bottom portion of the solo metal layer.

2. The semiconductor device of claim 1, wherein the single metal layer of the gate includes the base metal atoms and the combination metal atoms combined to the base metal atoms, and a composition of the combination metal atoms is gradually increased from the bottom portion of the single metal layer to the top portion of the single metal layer or from the top portion of the single metal layer to the bottom portion of the single metal layer.

3. The semiconductor device of claim 2, wherein the combination metal atoms include work function-adjusting metal atoms.

4. The semiconductor device of claim 3, wherein the composition of the combination metal atoms is changed from a surface of the gate insulating layer in a central direction of the gate.

5. The semiconductor device of claim 1, wherein the composition of the metal atoms in the gate is gradually increased from the bottom portion of the single metal layer to the top portion of the single metal layer or from the top portion of the single metal layer to the bottom portion of the single metal layer.

6. A semiconductor device comprising:

a substrate including a fin-type active region;

at least one nano-sheet stack structure on the substrate, the at least one nano-sheet stack structure spaced apart from a top surface of the fin-type active region, the at least one nano-sheet stack structure including a plurality of nano-sheets each including a channel region;

a gate covering the at least one nano-sheet stack structure, the gate including a main gate portion on the at least one nano-sheet stack structure and sub-gate portions below each of the plurality of nano-sheets, the main gate portion including a single metal layer having different compositions of metal atoms at a top surface and a bottom surface thereof,
  a top surface of the main gate portion being a top portion of the single metal layer,
  a bottom surface of the main gate portion being a bottom portion of the single metal layer,
  the single metal layer of the gate including base metal atoms and combination metal atoms combined to the base metal atoms, and
  a composition of the combination metal atoms being increased from the bottom portion of the single metal layer to the top portion of the single metal layer or from the top portion of the single metal layer to the bottom portion of the single metal layer;

a gate insulating layer between the at least one nano-sheet stack structure and the gate; and source/drain regions in the fin-type active region, the source/drain regions at a side of the at least one nano-sheet stack structure, wherein the sub-gate portions include a solo metal layer having different compositions of metal atoms at a top surface and a bottom surface thereof,
  a top surface of the sub-gate portion is a top portion of the solo metal layer,
  a bottom surface of the sub-gate portion is a bottom portion of the solo metal layer,
  the solo metal layer of the sub-gate portions include the base metal atoms and the combination metal atoms combined to the base metal atoms, and
  a composition of the combination metal atoms in the sub-gate portions is gradually increased from the bottom portion of the solo metal layer to the top portion of the solo metal layer or from the top portion of the solo metal layer to the bottom portion of the solo metal layer.

7. The semiconductor device of claim 6, wherein the combination metal atoms include work function-adjusting metal atoms.

8. The semiconductor device of claim 6, wherein thicknesses of the sub-gate portions are identical to one another.

9. The semiconductor device of claim 6, wherein a thickness of a bottommost sub-gate portion among the sub-gate portions is greater than thicknesses of other sub-gate portions among the sub-gate portions.

10. The semiconductor device of claim 6, wherein the at least one nano-sheet stack structure includes nano-sheet stack structures, the main gate portion includes a barrier metal layer on a topmost nano-sheet among the nano-sheet stack structures and a main metal layer on the barrier metal layer, and compositions of metal atoms of a surface of the barrier metal layer and a bottom of the barrier metal layer are different from each other.

11. The semiconductor device of claim 6, wherein the semiconductor device includes a PMOS transistor.

12. The semiconductor device of claim 6, wherein the semiconductor device includes a NMOS transistor.

* * * * *